(12) United States Patent
Hosoya et al.

(10) Patent No.: US 7,652,544 B2
(45) Date of Patent: Jan. 26, 2010

(54) VOLTAGE CONTROLLED OSCILLATOR AND FREQUENCY CONTROL METHOD OF THE VOLTAGE CONTROLLED OSCILLATOR

(75) Inventors: Kenichi Hosoya, Tokyo (JP); Shigeki Wada, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 11/885,859

(22) PCT Filed: Jan. 26, 2006

(86) PCT No.: PCT/JP2006/301181

§ 371 (c)(1),
(2), (4) Date: Sep. 7, 2007

(87) PCT Pub. No.: WO2006/095502

PCT Pub. Date: Sep. 14, 2006

(65) Prior Publication Data

US 2008/0150644 A1 Jun. 26, 2008

(30) Foreign Application Priority Data

Mar. 8, 2005 (JP) .............................. 2005-063651

(51) Int. Cl.
*H03B 5/12* (2006.01)
(52) U.S. Cl. .......................... 331/117 R; 331/117 FE; 331/177 R; 331/177 V
(58) Field of Classification Search ............. 331/116 R, 331/116 FE, 117 R, 117 FE, 117 D, 177 R, 331/177 V, 179, 185, 186
See application file for complete search history.

(56) References Cited

U.S. PATENT DOCUMENTS 6,791,426 B2 * 9/2004 Sato ....................... 331/117 R 2004/0061565 A1 * 4/2004 Austin et al. ............ 331/177 V

FOREIGN PATENT DOCUMENTS

| JP | 8-78486 | 3/1996 |
|---|---|---|
| JP | 11-261301 | 9/1999 |
| JP | 2000-124713 | 4/2000 |
| JP | 2002-208819 | 7/2002 |
| JP | 2003-198249 | 7/2003 |
| JP | 2003-324316 | 11/2003 |
| JP | 2004-120215 | 4/2004 |
| JP | 2004-120728 | 4/2004 |
| JP | 2004-147310 | 5/2004 |
| JP | 2004-159222 | 6/2004 |
| JP | 2004-289339 | 10/2004 |

* cited by examiner

*Primary Examiner*—David Mis
(74) *Attorney, Agent, or Firm*—McGinn IP Law Group, PLLC

(57) ABSTRACT

A voltage controlled oscillator of the present invention includes power supply terminal (101), control terminal (2) for controlling an output frequency, output terminals (3a, 3b), cross-coupled transistors (5a, 5b), capacitances (6a, 6b, 7a, 7b), LC tanks (10a, 10b), resistor (117), grounding capacitance (18) and center frequency control circuit (16). Center frequency control circuit (16) includes resistors (11a, 11b), grounding capacitance (12), center frequency control terminal (4) for controlling a center frequency of the output frequency, and voltage-divider circuit (15). Resistors (11a, 11b) are connected to the base terminals of cross-coupled transistors (5a, 5b), the other ends of resistors (11a, 11b) are connected to each other, and, to this connecting point, one end of grounding capacitance (12) and one end of voltage-divider circuit (15) are connected. The other end of voltage-divider circuit (15) is connected to center frequency control terminal (4).

11 Claims, 21 Drawing Sheets

VOLTAGE CONTROLLED OSCILLATOR AND FREQUENCY CONTROL METHOD OF THE VOLTAGE CONTROLLED OSCILLATOR

TECHNICAL FIELD

The present invention relates to a voltage controlled oscillator (VCO) and a frequency control method of the voltage controlled oscillator, and particularly to a cross-coupled voltage controlled oscillator used in a microwave or millimeter-wave frequency band and a frequency control method of the voltage controlled oscillator.

BACKGROUND ART

Conventionally, in a microwave or millimeter-wave frequency band, a cross-coupled voltage controlled oscillator is used. The cross-coupled voltage controlled oscillator is a circuit which changes an oscillation frequency by controlling a voltage supplied to a control terminal. The cross-coupled voltage controlled oscillator, generally, includes a power supply terminal and a control terminal. To the power supply terminal, a fixed voltage is supplied, and to the control terminal, a control voltage for controlling the oscillation frequency is supplied.

Now, a conventional cross-coupled voltage controlled oscillator will be hereinafter described with reference to the accompanying drawings. In addition, in the following description, the "electrostatic capacitance" may be simply called the "capacitance".

FIG. 1 is a circuit diagram illustrating one example of a configuration of the conventional cross-coupled voltage controlled oscillator.

Referring to FIG. 1, the cross-coupled voltage controlled oscillator of this conventional example includes power supply terminal 1 to which positive power supply voltage Vcc is supplied, control terminal 2 to which control voltage $V_{cont}$ for controlling an oscillation frequency is supplied, output terminals 3a, 3b, cross-coupled transistors 5a, 5b whose collector terminals and base terminals are connected to each other in a cross-coupled arrangement, direct current blocking capacitances 7a, 7b for blocking a direct current, LC tanks 10a, 10b, resistor 17 for grounding emitter terminals of cross-coupled transistors 5a, 5b and grounding capacitances 21a, 21b.

LC tank 10a, 10b is a resonant circuit including variable capacitance 8a, 8b and inductor 9a, 9b. To the collector terminals and the base terminals of cross-coupled transistors 5a, 5b, power supply voltage Vcc is supplied from common power supply terminal 1 through LC tank 10a, 10b. To the collector terminal of cross-coupled transistor 5a and the base terminal of cross-coupled transistor 5b, a common voltage is supplied from LC tank 10a, and to the collector terminal of cross-coupled transistor 5b and the base terminal of cross-coupled transistor 5a, a common voltage is supplied from LC tank 10b.

The cross-coupled voltage controlled oscillator of this conventional example has an emitter-coupled differential amplifier formed therein by connecting the base terminals and the collector terminals of cross-coupled transistors 5a, 5b to each other in a cross-coupled arrangement. Further, the collector terminals of cross-coupled transistors 5a, 5b are connected to each other through LC tanks 10a, 10b.

The cross-coupled voltage controlled oscillator of this conventional example is configured as described above and as a result, a positive feedback can be provided. At this time, cross-coupled transistors 5a, 5b allow electricity to travel through each other. In response to this, LC tanks 10a, 10b are excited to oscillate. With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2.

FIG. 2 is a graph in which control voltage $V_{cont}$ supplied to control terminal 2 is shown in the horizontal axis and oscillation frequency f of a signal provided from output terminals 3a, 3b is shown in the longitudinal axis. Such a characteristic is called the "input/output characteristic of cross-coupled voltage controlled oscillator". Further, some control voltage that is determined by a characteristic of an external circuit etc. is called the "center voltage $V_0$", and an oscillation frequency corresponding to center voltage $V_0$ is called the "center frequency $f_0$". The input/output characteristic (voltage-frequency curve) shown in FIG. 2 shows a single band operation of the cross-coupled voltage controlled oscillator of this conventional example.

In addition, the input/output characteristic in FIG. 2 shows a characteristic of tending downward, but it may be made to tend upward. For example, when varicap diodes are used for variable capacitances 8a, 8b, the characteristic can be made to tend upward by reversing the varicap diodes and inverting the polarity of a voltage supplied to variable capacitances 8a, 8b. Also, similarly, a cross-coupled voltage controlled oscillator of the present invention can achieve both the characteristics of tending upward and downward, but description of the characteristics of tending upward and downward will be hereinafter omitted.

FIG. 3 is a circuit diagram illustrating another example of a configuration of a conventional cross-coupled voltage controlled oscillator.

Referring to FIG. 3, in the cross-coupled voltage controlled oscillator of this conventional example, resistor 17 of the cross-coupled voltage controlled oscillator shown in FIG. 1 is replaced with current source 22.

FIG. 4 is a circuit diagram illustrating still another example of a configuration of a conventional cross-coupled voltage controlled oscillator. Referring to FIG. 4, the cross-coupled voltage controlled oscillator of this conventional example includes power supply terminal 101 to which negative power supply voltage $V_{EE}$ is supplied, control terminal 2 to which control voltage $V_{cont}$ for controlling an oscillation frequency is supplied, output terminals 3a, 3b, cross-coupled transistors 5a, 5b whose collector terminals and base terminals are connected to each other in a cross-coupled arrangement, direct current blocking capacitances 6a, 6b, 7a, 7b for blocking a direct current, LC tanks 10a, 10b, resistor 117 for connecting emitter terminals of cross-coupled transistors 5a, 5b to power supply terminal 101, and grounding resistors 33a, 33b for grounding the base terminals of cross-coupled transistors 5a, 5b. LC tank 10a, 10b is a resonant circuit including variable capacitance 8a, 8b and inductor 9a, 9b. To the emitter terminal of cross-coupled transistor 5a, 5b, negative power supply voltage $V_{EE}$ is supplied from power supply terminal 101 through resistor 117. To the base terminal, a voltage determined by grounding resistor 33a, 33b and a base current is supplied. With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2.

FIG. 5 is a circuit diagram illustrating still another example of a configuration of a conventional cross-coupled voltage controlled oscillator.

Referring to FIG. 5, the cross-coupled voltage controlled oscillator of this conventional example includes power supply terminal 101 to which negative power supply voltage $V_{EE}$ is supplied, control terminal 2 to which control voltage $V_{cont}$ for controlling an oscillation frequency is supplied, output terminals 3a, 3b, cross-coupled transistors 5a, 5b whose collector terminals and base terminals are connected to each other in a cross-coupled arrangement, direct current blocking capacitances 6a, 6b, 7a, 7b for blocking a direct current, LC tanks 10a, 10b, resistor 117 for connecting emitter terminals of cross-coupled transistors 5a, 5b to power supply terminal 101, resistors 35a, 35b for connecting the base terminals of cross-coupled transistors 5a, 5b to power supply terminal 101, and grounding resistors 34a, 34b for grounding the base terminals of cross-coupled transistors 5a, 5b.

LC tank 10a, 10b is a resonant circuit including variable capacitance 8a, 8b and inductor 9a, 9b. To the emitter terminal of cross-coupled transistor 5a, 5b, negative power supply voltage $V_{EE}$ is supplied from power supply terminal 101 through resistor 117. To the base terminal, power supply voltage $V_{EE}$ from power supply terminal 101 is divided by grounding resistor 34a and resistor 35a (or grounding resistor 34b and resistor 35b) that are to be supplied. With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2.

FIG. 6 is a circuit diagram illustrating still further example of a configuration of a conventional cross-coupled voltage controlled oscillator.

Referring to FIG. 6, the cross-coupled voltage controlled oscillator of this conventional example includes power supply terminal 101 to which negative power supply voltage $V_{EE}$ is supplied, control terminal 2 to which control voltage $V_{cont}$ for controlling an oscillation frequency is supplied, output terminals 3a, 3b, cross-coupled transistors 5a, 5b whose collector terminals and base terminals are connected to each other in a cross-coupled arrangement, direct current blocking capacitances 6a, 6b, 7a, 7b for blocking a direct current, LC tanks 10a, 10b, resistor 117 for connecting emitter terminals of cross-coupled transistors 5a, 5b to power supply terminal 101, grounding resistors 33a, 33b for grounding the base terminals of cross-coupled transistors 5a, 5b and capacitance bank 36.

LC tank 10a, 10b is a resonant circuit including variable capacitance 8a, 8b and inductor 9a, 9b. Capacity bank 36 includes a plurality (n) of capacitances 37a, 37b and a plurality of switches 38. To the emitter terminal of cross-coupled transistor 5a, 5b, negative power supply voltage $V_{EE}$ is supplied from power supply terminal 101 through resistor 117. To the base terminal, a voltage determined by grounding resistor 33a, 33b and a base current is supplied. With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2. Further, depending on the combination of on/off states of the plurality of switches 38 of capacitance bank 36, center frequency $f_0$ is discretely controlled. As the result, a plurality of characteristics discretely controlled as shown in FIG. 7 can be achieved.

FIG. 7 is a graph in which control voltage $V_{cont}$ supplied to control terminal 2 is shown in the horizontal axis and oscillation frequency f of a signal provided from output terminals 3a, 3b is shown in the longitudinal axis. The input/output characteristic shown in FIG. 7 shows that the cross-coupled voltage controlled oscillator of the conventional example performs a multi-band operation. In addition, as for the related art for discretely controlling the input/output characteristic, there are technologies disclosed in Japanese Patent Laid-Open No. 2004-120215 and No. 2004-159222.

FIG. 8 is a circuit diagram illustrating still another example of a configuration of a conventional cross-coupled voltage controlled oscillator.

Referring to FIG. 8, the cross-coupled voltage controlled oscillator of this conventional example includes power supply terminal 101 to which negative power supply voltage $V_{EE}$ is supplied, control terminal 2 to which control voltage $V_{cont}$ for controlling an oscillation frequency is supplied, output terminals 3a, 3b, cross-coupled transistors 5a, 5b whose collector terminals and base terminals are connected to each other in a cross-coupled arrangement, direct current blocking capacitances 6a, 6b, 7a, 7b for blocking a direct current, LC tanks 110a, 110b, resistor 117 for connecting emitter terminals of cross-coupled transistors 5a, 5b to power supply terminal 101 and grounding resistors 33a, 33b for grounding the base terminals of cross-coupled transistors 5a, 5b.

LC tank 110a, 110b is a resonant circuit including variable capacitance 8a, 8b and variable inductor 39a, 39b. To the emitter terminal of cross-coupled transistor 5a, 5b, negative power supply voltage $V_{EE}$ is supplied from power supply terminal 101 through resistor 117. To the base terminal, a voltage determined by grounding resistor 33a, 33b and a base current is supplied. With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2. Further, by controlling the inductance value of variable inductor 39a, 39b, center frequency $f_0$ is continuously controlled. As the result, a plurality of input/output characteristics continuously controlled as shown in FIG. 9 can be achieved.

FIG. 9 is a graph in which control voltage $V_{cont}$ supplied to control terminal 2 is shown in the horizontal axis and oscillation frequency f of a signal provided from output terminals 3a, 3b is shown in the longitudinal axis. The input/output characteristic shown in FIG. 9 shows that the cross-coupled voltage controlled oscillator of the conventional example performs a continuous multi-band operation.

As described above, in the cross-coupled voltage controlled oscillators shown in FIGS. 1, 3, 4 and 5, only one input/output characteristic as shown in FIG. 2 can be achieved. That is, these cross-coupled voltage controlled oscillators can not perform a multi-band operation, because they perform a single band operation. When these cross-coupled voltage controlled oscillators are used in a phase-locked loop (PLL) circuit employed for radio communication systems etc, their operation in a plurality of frequency bands (multi-band) can not be carried out. Further, when these cross-coupled voltage controlled oscillators are used in a clock and data recovery (CDR) circuit etc. employed for optical communication systems etc, their operation at a plurality of bit rates can not be carried out.

Further, in the cross-coupled voltage controlled oscillator shown in FIG. 6, because a plurality of discrete input/output characteristics can be achieved, a multi-band operation can be performed. However, because a capacitance bank including a plurality of capacitances and a plurality of switches is necessary for this cross-coupled voltage controlled oscillator, the circuit becomes complex. Therefore, it is difficult to provide a multi-band operation especially in a very high frequency band such as a millimeter-wave frequency band by using this cross-coupled voltage controlled oscillator.

Further, because even the cross-coupled voltage controlled oscillator shown in FIG. 8 can provide a plurality of continuous input/output characteristics, a multi-band operation can be achieved. However, because the variable inductor is usually formed by technologies such as MEMS (Micro Electro Mechanical Systems), this cross-coupled voltage controlled oscillator becomes complex in structure and in the production process. Therefore, this cross-coupled voltage controlled oscillator is unsuitable, especially in a very high frequency band such as a millimeter-wave frequency band.

DISCLOSURE OF THE INVENTION

Therefore, an object of the present invention is to provide a voltage controlled oscillator which can achieve a plurality of continuous input/output characteristics across a wider bandwidth by being implemented using a simple configuration, and a frequency control method of the voltage controlled oscillator.

The present invention is applied to a voltage controlled oscillator which includes a frequency control terminal, a variable capacitance and a transistor, and variably changes an output frequency depending on the voltage supplied from the frequency control terminal.

The voltage controlled oscillator of the present invention is characterized by comprising: a first frequency control terminal to which a voltage for controlling an output frequency by changing the capacitance of a variable capacitance is supplied, as a frequency control terminal; and a second frequency control terminal to which a voltage for controlling a center frequency of the output frequency by changing the characteristic of a transistor is supplied, as a frequency control terminal.

According to this configuration, because not only the output frequency is controlled by the voltage supplied from the first frequency control terminal, but the center frequency of the output frequency is also controlled by the voltage supplied from the second frequency control terminal, a plurality of continuous input/output characteristics can be achieved.

Therefore, a voltage controlled oscillator, which can perform multi-band operations and which can provide a plurality of continuous input/output characteristics across a wider bandwidth by being implemented using a simple configuration, can be achieved.

BEST MODE FOR CARRYING OUT THE INVENTION

Now, exemplary embodiments will be hereinafter described in detail with reference to the accompanying drawings.

FIRST EXEMPLARY EMBODIMENT

Figure 10:
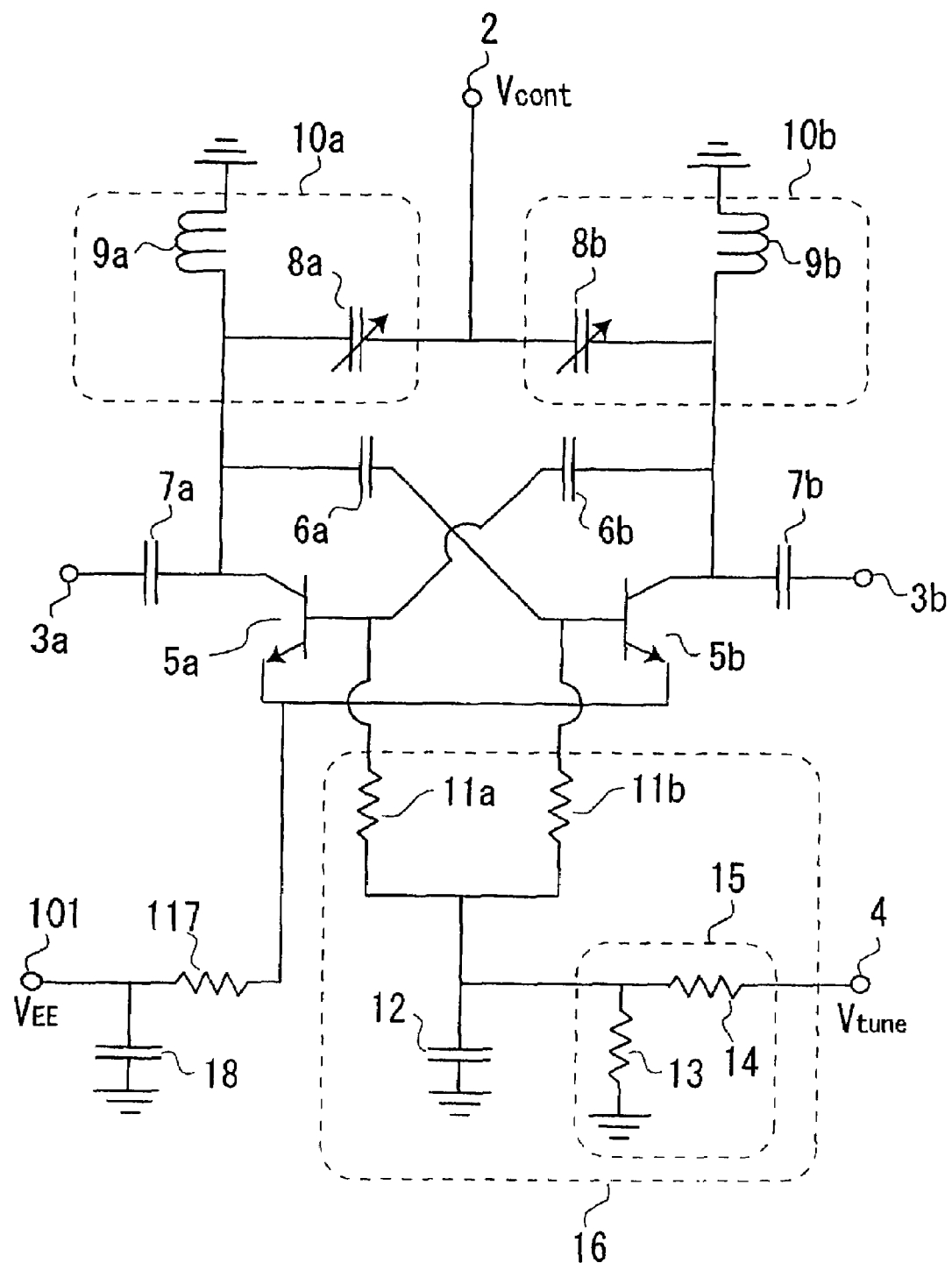
FIG. 10 is a circuit diagram illustrating a configuration of a voltage controlled oscillator according to a first exemplary embodiment.

FIG. 10 is a circuit diagram illustrating a configuration of a cross-coupled voltage controlled oscillator according to a first exemplary embodiment.

Referring to FIG. 10, the cross-coupled voltage controlled oscillator of this exemplary embodiment includes power supply terminal 101 to which negative power supply voltage $V_{EE}$ is supplied, control terminal 2 to which control voltage $V_{cont}$ for controlling an oscillation frequency is supplied, output terminals 3a, 3b for outputting a signal having the oscillation frequency variably controlled, cross-coupled transistors 5a, 5b whose collector terminals and base terminals are connected to each other in a cross-coupled arrangement, direct current blocking capacitances 6a, 6b, 7a, 7b for blocking a direct current, LC tanks 10a, 10b as a resonant circuit, resistor 117 for connecting emitter terminals of cross-coupled transistors 5a, 5b to power supply terminal 101, grounding capacitance 18 for grounding power supply terminal 101 and center frequency control circuit 16 connected to the base terminals of cross-coupled transistors 5a, 5b.

LC tank 10a, 10b is a resonant circuit including variable capacitance 8a, 8b and inductor 9a, 9b. Further, center frequency control circuit 16 includes resistors 11a, 11b, grounding capacitance 12, center frequency control terminal 4 and voltage-divider circuit 15. Voltage-divider circuit 15 includes resistors 13, 14. Voltage-divider circuit 15 provides a signal by dividing center frequency control voltage $V_{tune}$ supplied from center frequency control terminal 4 using resistors 13, 14. One end of resistor 11a, 11b is respectively connected to the base terminal of cross-coupled transistor 5a, 5b, and the other ends are connected to each other. To this connection point of the other ends, one end of grounding capacitance 12 and one end of voltage-divider circuit 15 are connected. The other end of voltage-divider circuit 15 is connected to center frequency control terminal 4.

In addition, control terminal 2 forms a first frequency control terminal or first frequency control means. Further, center frequency control terminal 4 forms a second frequency control terminal, and center frequency control circuit 16 forms second frequency control means.

Now, operation of the cross-coupled voltage controlled oscillator of this exemplary embodiment will be described hereinafter.

The direct current operating point of cross-coupled transistor 5a, 5b is determined by power supply voltage $V_{EE}$ supplied from power supply terminal 101 through resistor 117 and center frequency control voltage $V_{tune}$ supplied from center frequency control terminal 4 through center frequency control circuit 16. Direct current blocking capacitance 6a separates the collector terminal of cross-coupled transistor 5a and the base terminal of cross-coupled transistor 5b in a direct current region. Further, direct current blocking capacitance 6b separates the collector terminal of cross-coupled transistor 5b and the base terminal of cross-coupled transistor 5a in a direct current region. Also, direct current blocking capacitance 7a, 7b separates the collector terminal of cross-coupled transistor 5a, 5b and an external circuit in a direct current region. Further, direct current blocking capacitance 6a, 6b separates center frequency control circuit 16 and the collector terminal of cross-coupled transistor 5a, 5b in a direct current region.

Figure 1:
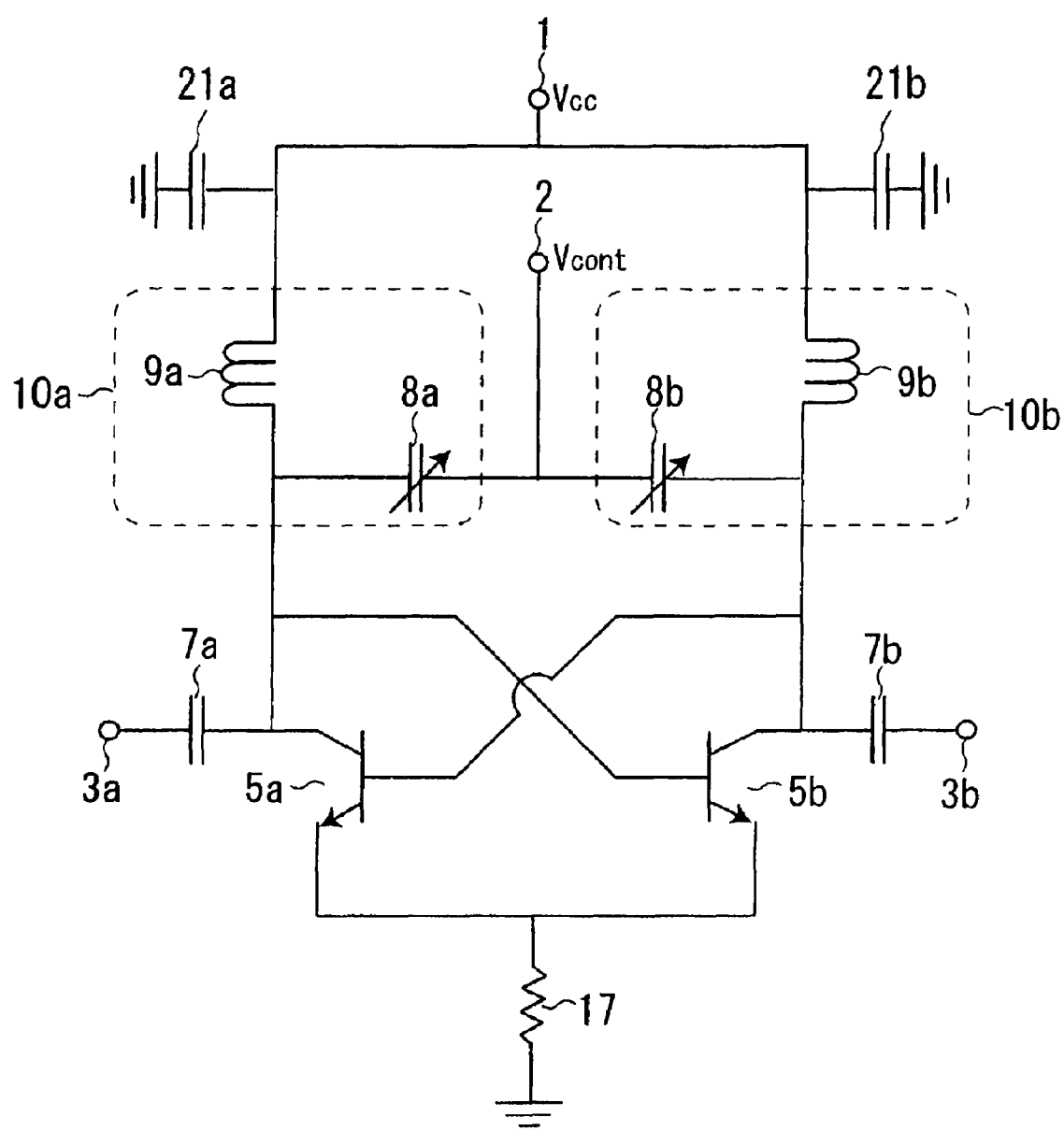
FIG. 1 is a circuit diagram illustrating one example of a configuration of a conventional voltage controlled oscillator.
Figure 2:
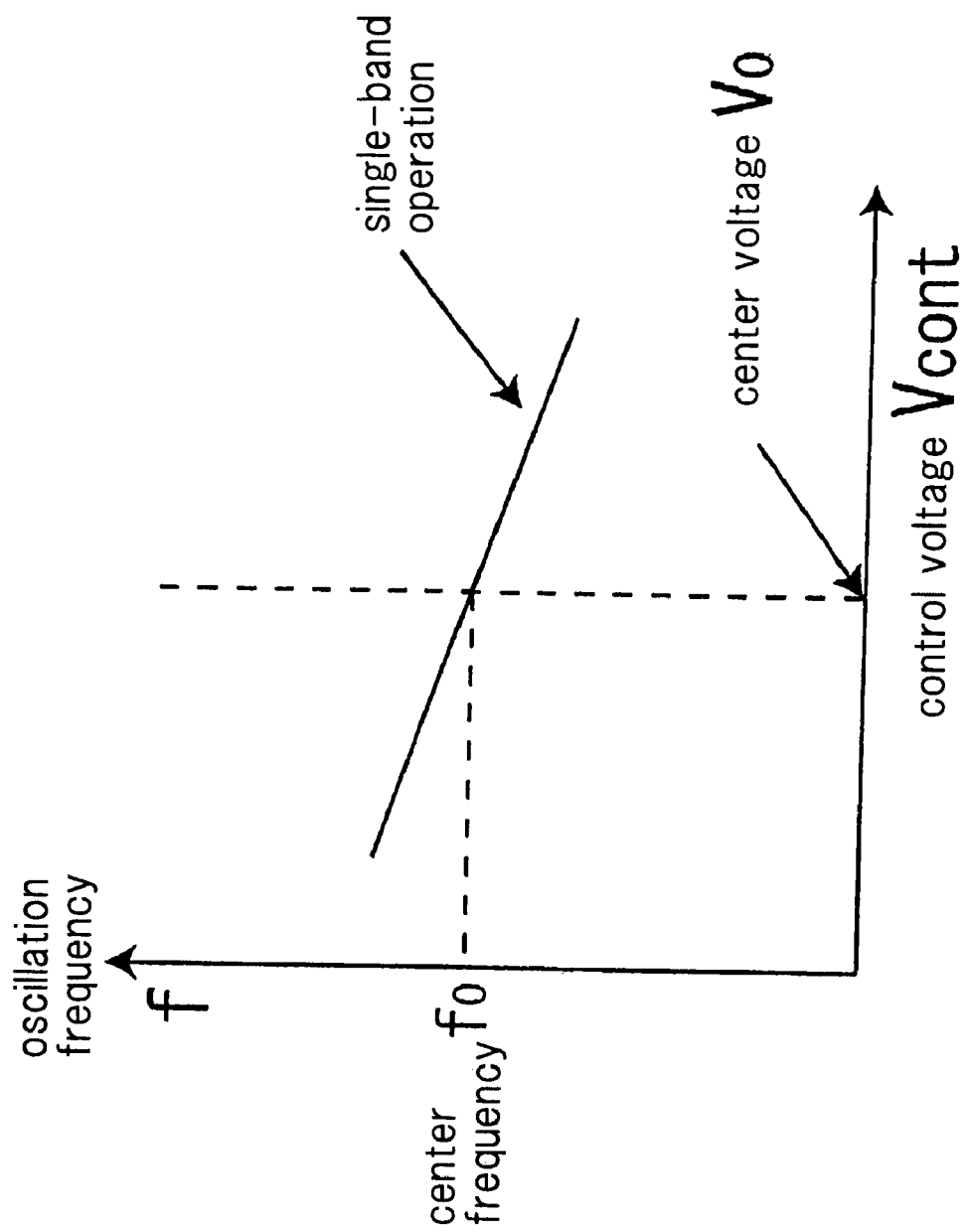
FIG. 2 is a view illustrating single band operation of a voltage controlled oscillator.
Figure 3:
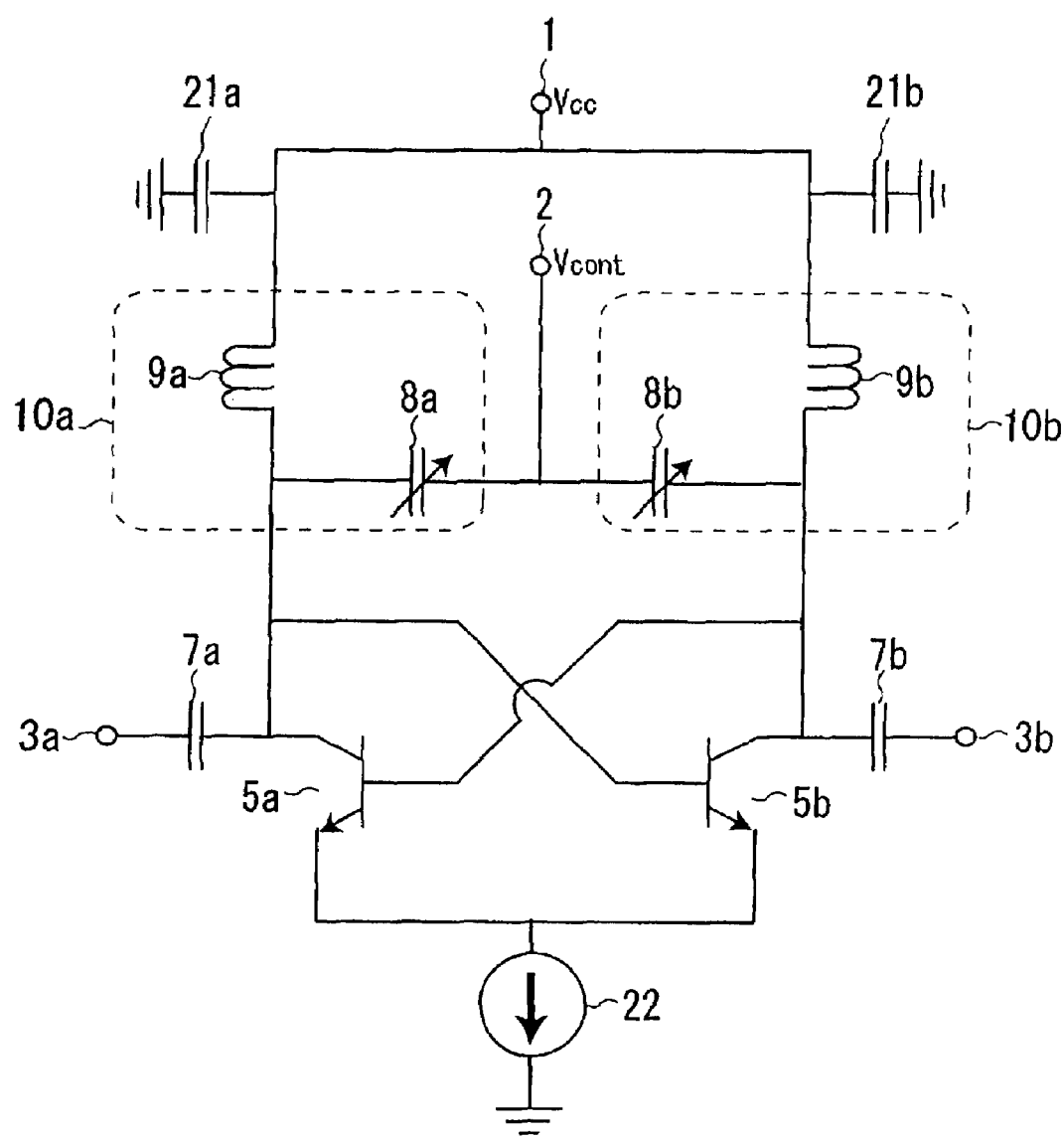
FIG. 3 is a circuit diagram illustrating another example of a configuration of a conventional voltage controlled oscillator.
Figure 4:
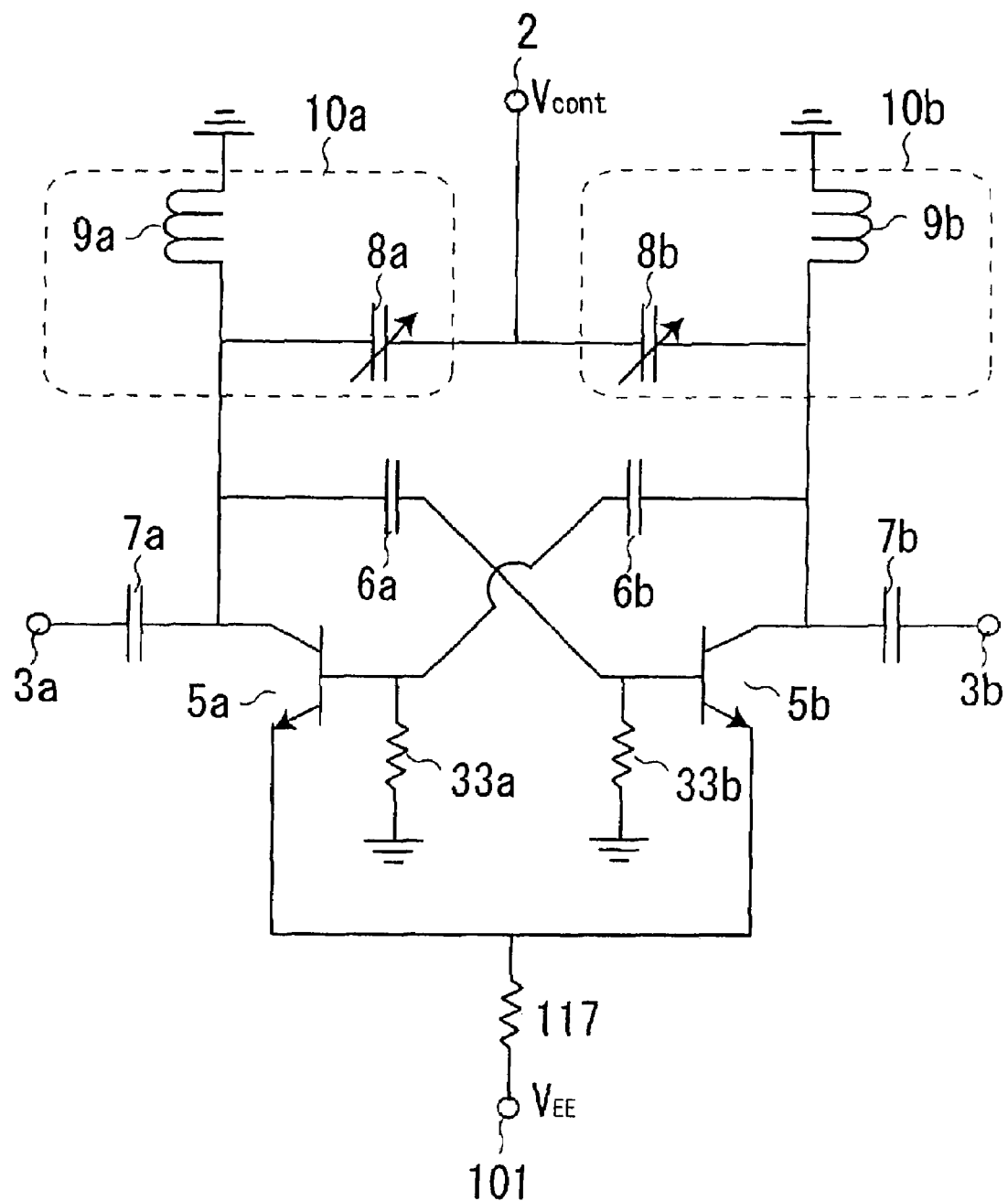
FIG. 4 is a circuit diagram illustrating still another example of a configuration of a conventional voltage controlled oscillator.
Figure 5:
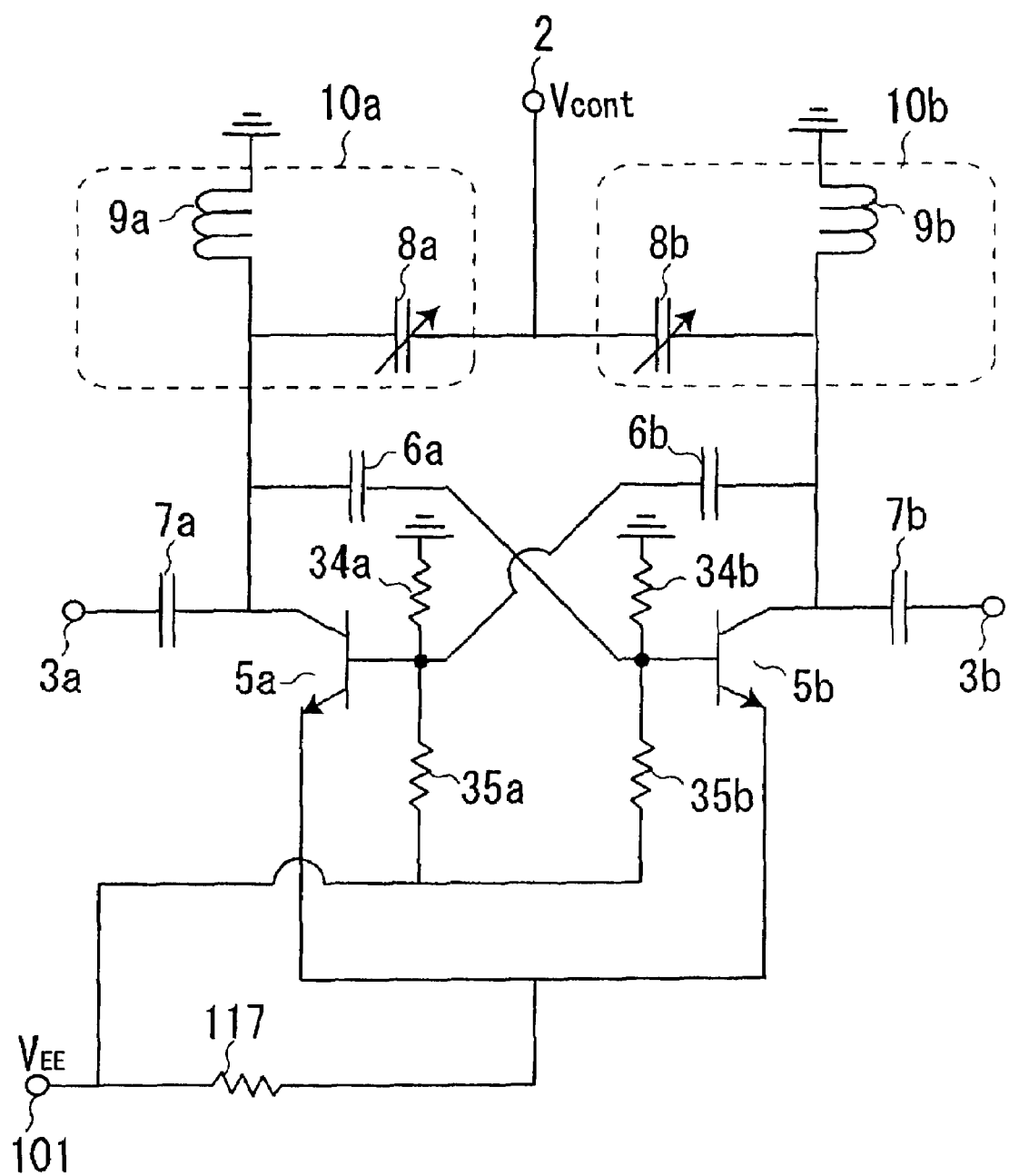
FIG. 5 is a circuit diagram illustrating further example of a configuration of a conventional voltage controlled oscillator.
Figure 6:
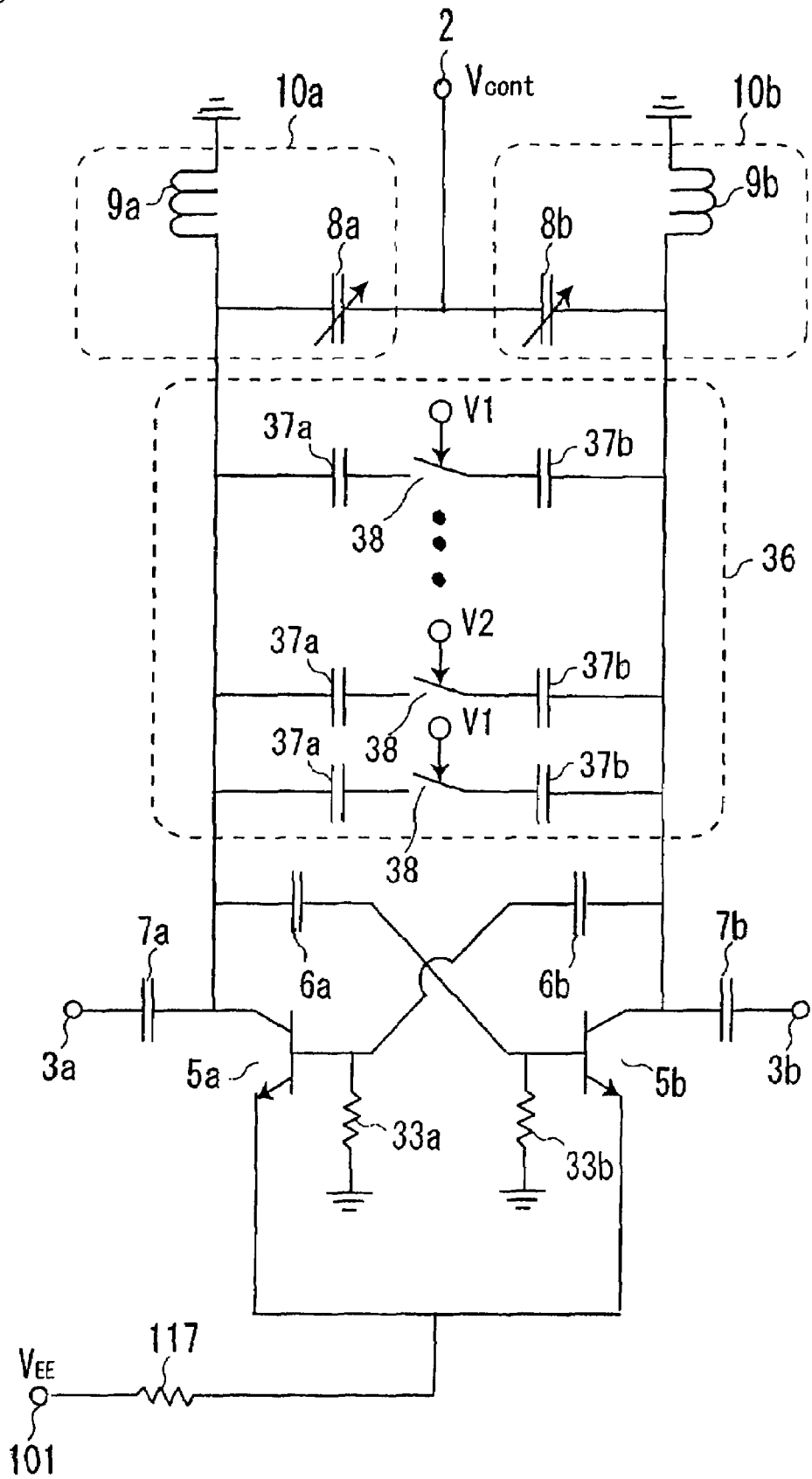
FIG. 6 is a circuit diagram illustrating still further example of a configuration of a conventional voltage controlled oscillator.
Figure 7:
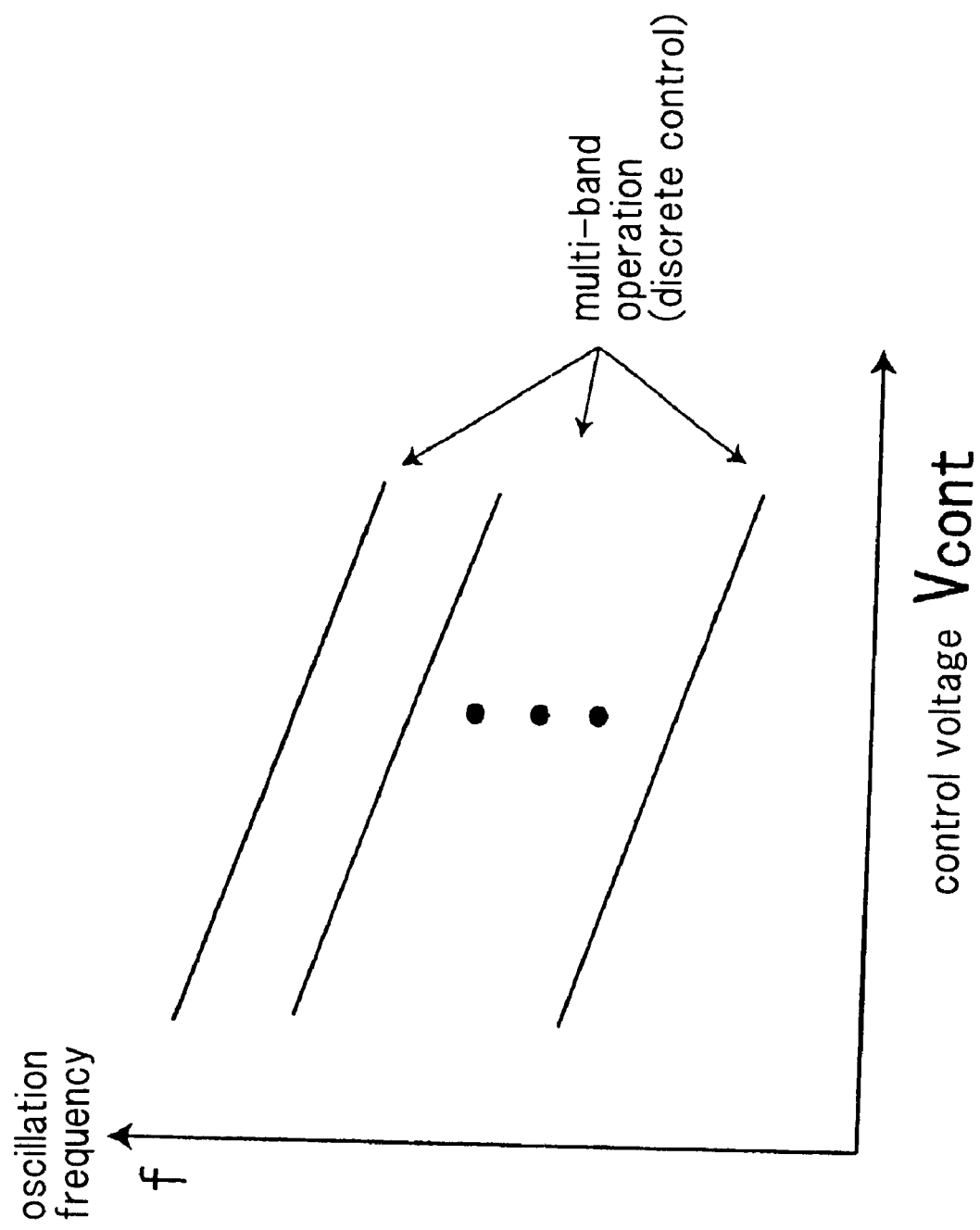
FIG. 7 is a view illustrating the discrete, multi-band operation of a voltage controlled oscillator.
Figure 8:
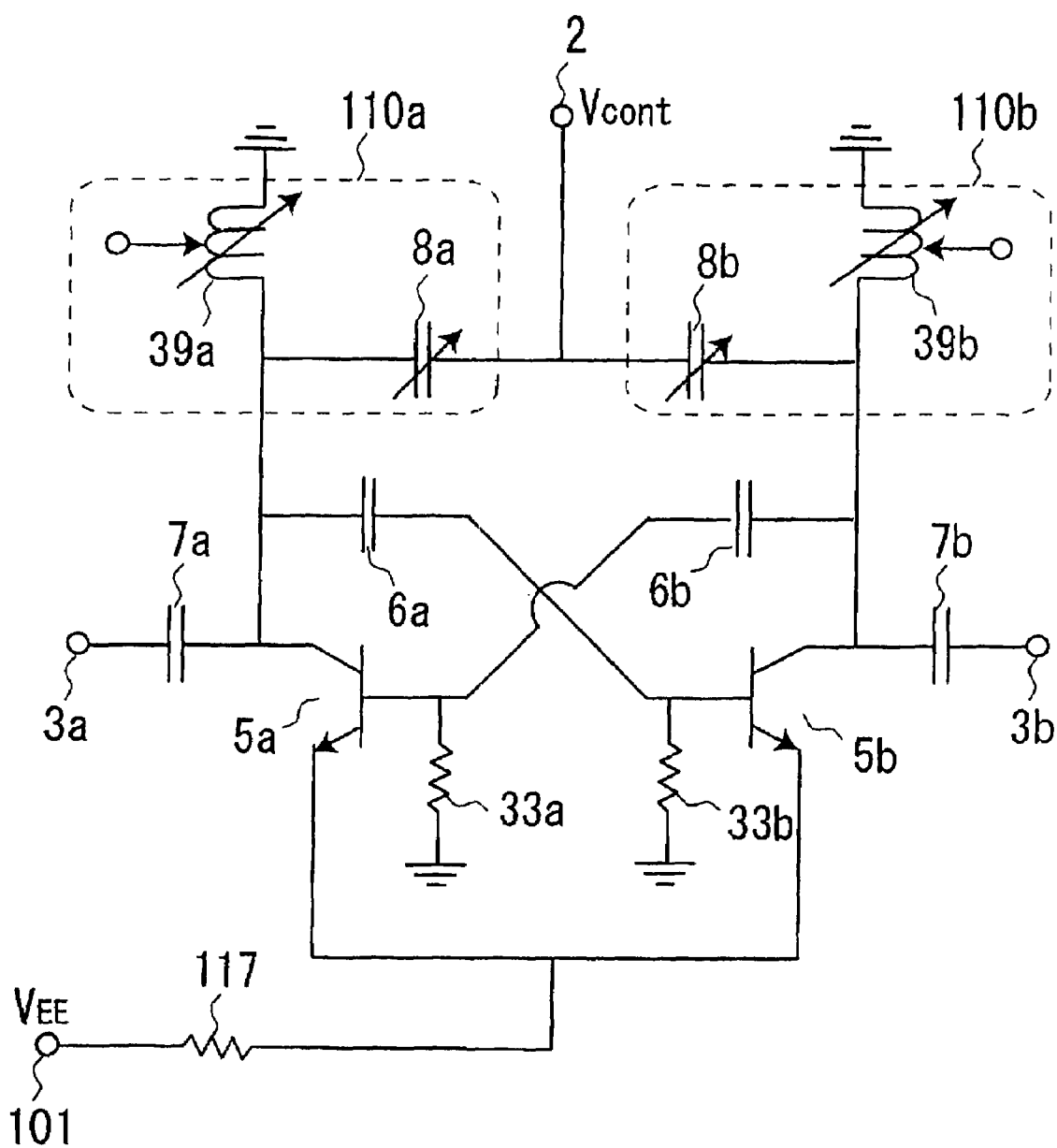
FIG. 8 is a circuit diagram illustrating still another example of a configuration of a conventional voltage controlled oscillator.

With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2.

In order to implement a phase-locked loop (PLL) circuit capable of operating in a plurality of frequency bands or a clock and data recovery (CDR) circuit capable of operating at a plurality of bit rates, it is necessary to control center frequency $f_0$ for center voltage $V_0$ to provide a plurality of input/output characteristics.

In this exemplary embodiment, the base voltage of cross-coupled transistor 5a, 5b is controlled based on center frequency control voltage $V_{tune}$ supplied from center frequency control terminal 4 through center frequency control circuit 16. Accordingly, the characteristic of cross-coupled transistor 5a, 5b, especially the junction capacitance between the base terminal and the collector terminal is changed, providing a plurality of input/output characteristics.

Resistors 11a, 11b separate the base terminals of cross-coupled transistors 5a, 5b from each other in a high-frequency region. Further, to avoid the effect caused by a change in impedance of the external circuit connected to center frequency control terminal 4, grounding capacitance 12 is provided.

Oscillation frequency f is strongly dependent on the characteristic of cross-coupled transistor 5a, 5b, especially the junction capacitance between the base terminal and the collector terminal. Therefore, according to such configuration, center frequency $f_0$ can be controlled across a wider bandwidth.

Figure 9:
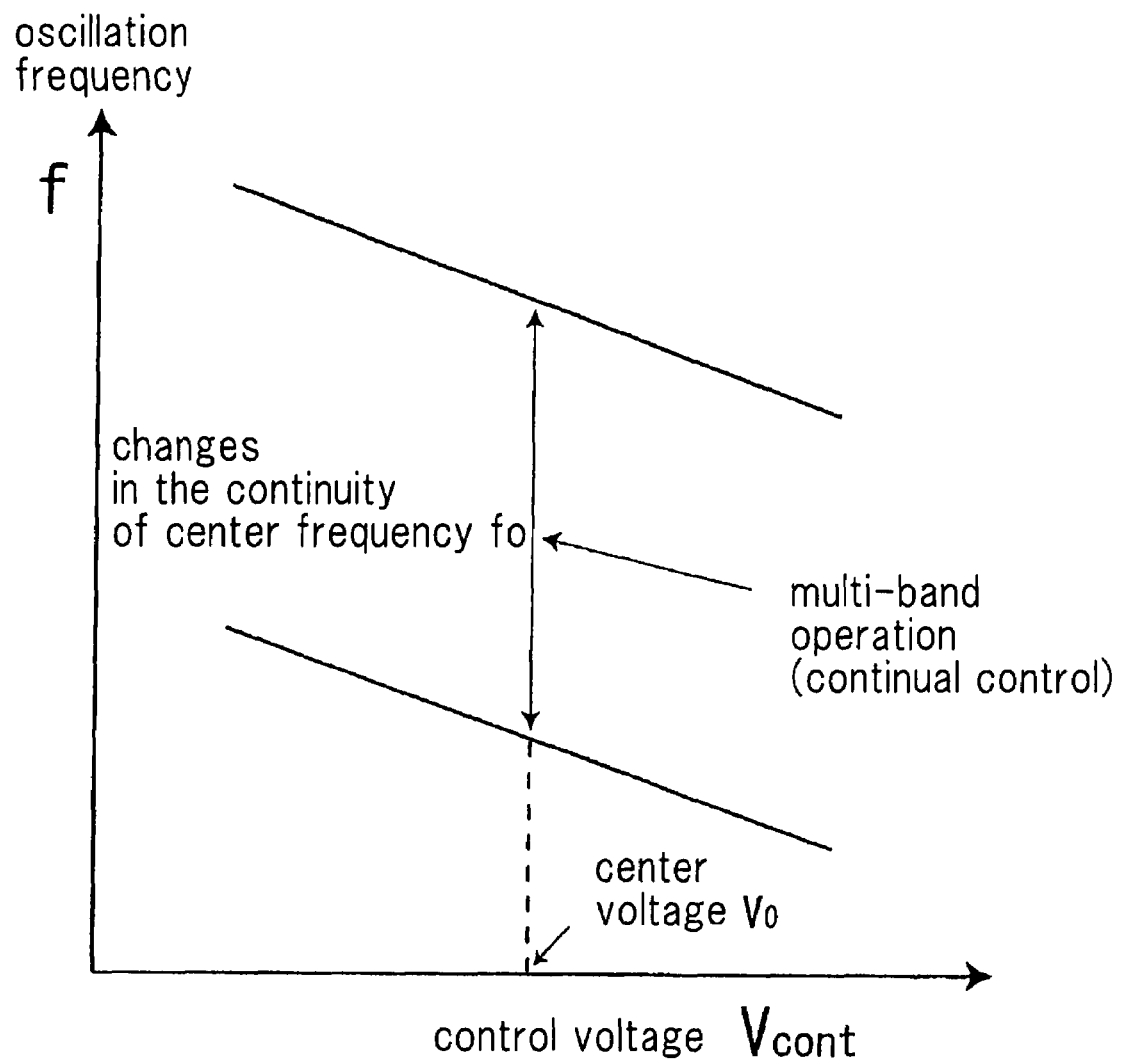
FIG. 9 is a view illustrating the continuous, multi-band operation of a voltage controlled oscillator.

That is, continuous, input/output characteristics across a wider bandwidth as shown in FIG. 9 can be provided, and multi-band operation across a wider range can be performed. More particularly, center frequency control voltage $V_{tune}$ variably changes the center frequency $f_0$ for center voltage $V_0$ to continuously control the input/output characteristic.

When such configuration is used, oscillation frequency f, as described above, is strongly dependent on the characteristic of cross-coupled transistor 5a, 5b, especially the junction capacitance between the base terminal and the collector terminal. Therefore, according to the effect caused by a variation in voltage of center frequency control voltage $V_{tune}$, or the effect of external noises mixed into center frequency control circuit 16, the oscillation operation tends to become unstable. To suppress these effects, in this exemplary embodiment, voltage-divider circuit 15 is provided.

Further, when such configuration is used, control of center frequency $f_0$ sometime causes a problem in which the oscillation output power largely changes. The present inventors, based on their research, found that this problem may be avoided by suitably selecting a value of resistor 117 for supplying power. This suitable value is generally not large enough to separate the external circuit in a high-frequency region. Therefore, to avoid the effect caused by a change in the impedance of the external circuit, in this exemplary embodiment, grounding capacitance 18 is provided.

As described above in this exemplary embodiment, while maintaining the stability against change in power supply voltage or maintaining the stability of external noises, the multi-band operation across a wider bandwidth can be provided using a simple configuration. At this time, an output-power variation can be concurrently avoided.

SECOND EXEMPLARY EMBODIMENT

Figure 11:
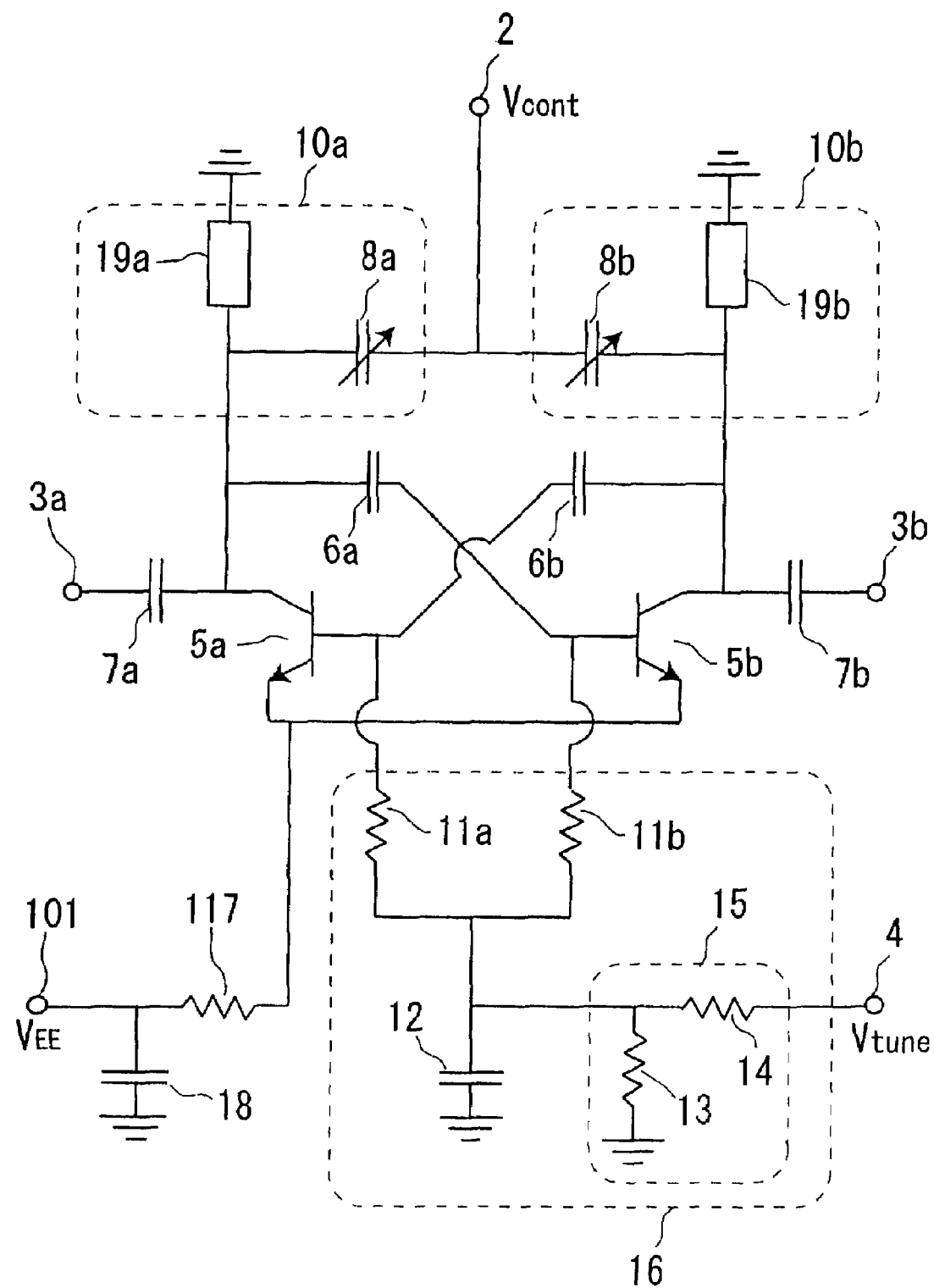
FIG. 11 is a circuit diagram illustrating a configuration of a voltage controlled oscillator according to a second exemplary embodiment.

FIG. 11 is a circuit diagram illustrating a configuration of a cross-coupled voltage controlled oscillator according to a second exemplary embodiment. In addition, in FIG. 11, the same part as in the first exemplary embodiment shown in FIG. 10 is denoted by the same symbol.

Referring to FIG. 11, the cross-coupled voltage controlled oscillator of the exemplary embodiment has inductors 9a, 9b of the cross-coupled voltage controlled oscillator shown in FIG. 10 replaced with transmission lines 19a, 19b. In a very high frequency band in which it is difficult for a spiral inductor etc. to be formed accurately, a method by which an inductor component is formed of a transmission line in such way is suitable.

Now, operation of the cross-coupled voltage controlled oscillator of this exemplary embodiment will be hereinafter described using the simulation result. In the simulation, assuming that the cross-coupled voltage controlled oscillator of the exemplary embodiment is applied to a clock and data recovery circuit for optical communication systems capable of corresponding to bit rates of 39.8 Gbps and 43.0 Gbps, the oscillation frequency was set to about 40 GHz. The transistor was assumed to be an InP (indium phosphorus)-based HBT (heterojunction bipolar transistor). The simulation was run using a harmonic balance method.

Figure 12:
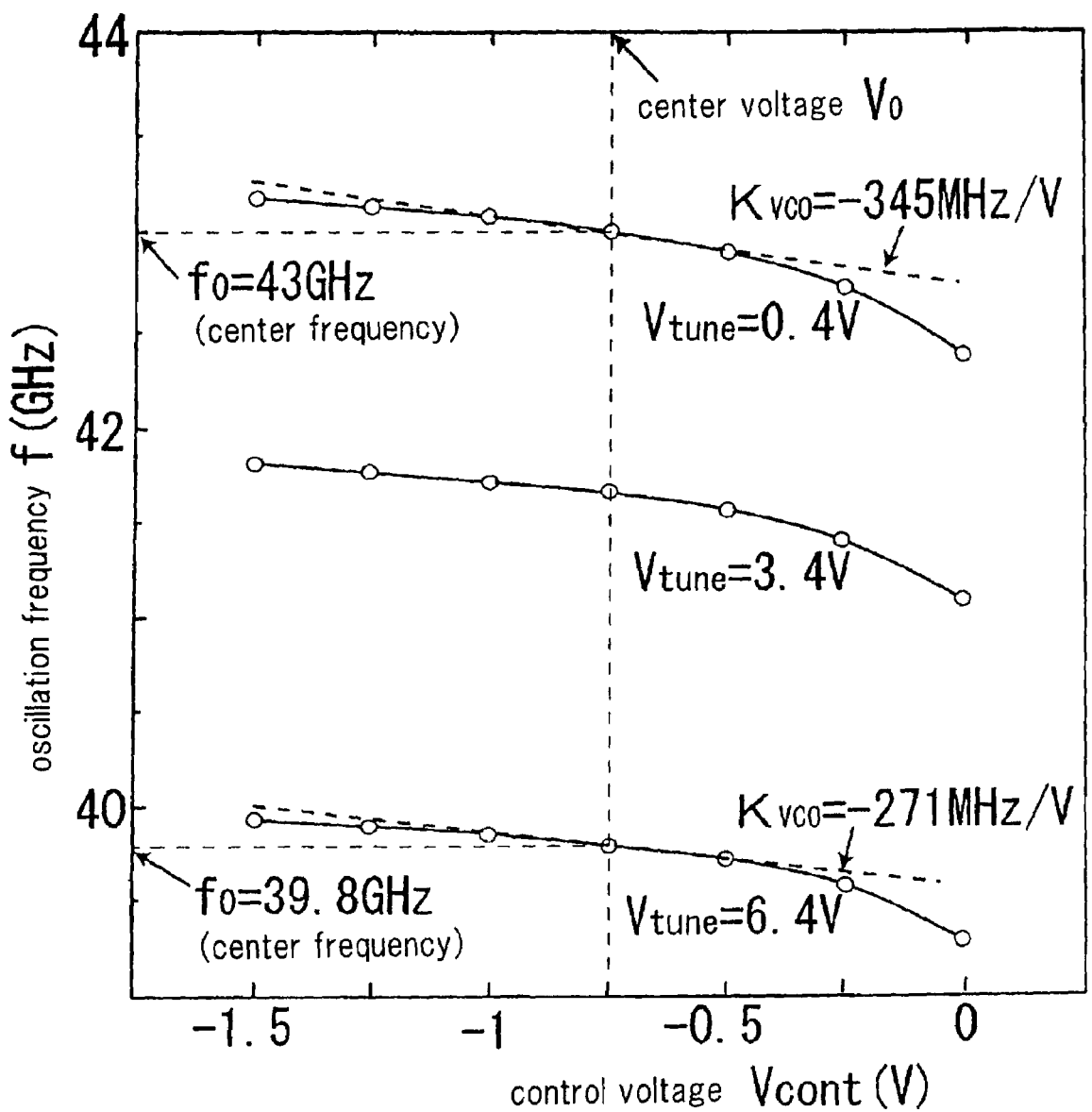
FIG. 12 is a view illustrating the simulation result of input/output characteristics of a voltage controlled oscillator of the present invention.

FIG. 12 shows the simulation result of input/output characteristics for center frequency control voltages $V_{tune}$ of 0.4 V, 3.4 V and 6.4 V.

In FIG. 12, the uppermost part shows the input/output characteristic with center frequency control voltage $V_{tune}$ being 0.4 V. When center voltage $V_0$ of control voltage $V_{cont}$ is −0.75 V, center frequency $f_0$ is 43 GHz and a gain $K_{VCO}$ of the voltage controlled oscillator (a rate of change to control voltage $V_{cont}$ of oscillation frequency f) is −345 MHz/V. Further, the lowermost part shows the input/output characteristic with center frequency control voltage $V_{tune}$ being 6.4 V. When center voltage $V_0$ of control voltage $V_{cont}$ is −0.75 V, center frequency $f_0$ is 39.8 GHz and the gain $K_{VCO}$ of the voltage controlled oscillator is −271 MHz/V.

Therefore, multi-band operation was provided within a targeted range from 39.8 GHz to 43 GHz. Further, the change of the gain $K_{VCO}$ of the voltage controlled oscillator generated by controlling the center frequency is between −345 MHz/V and −271 MHz/V and it is a change of about 25%, and this does not cause any problem in design of phase locked loop.

Figure 13:
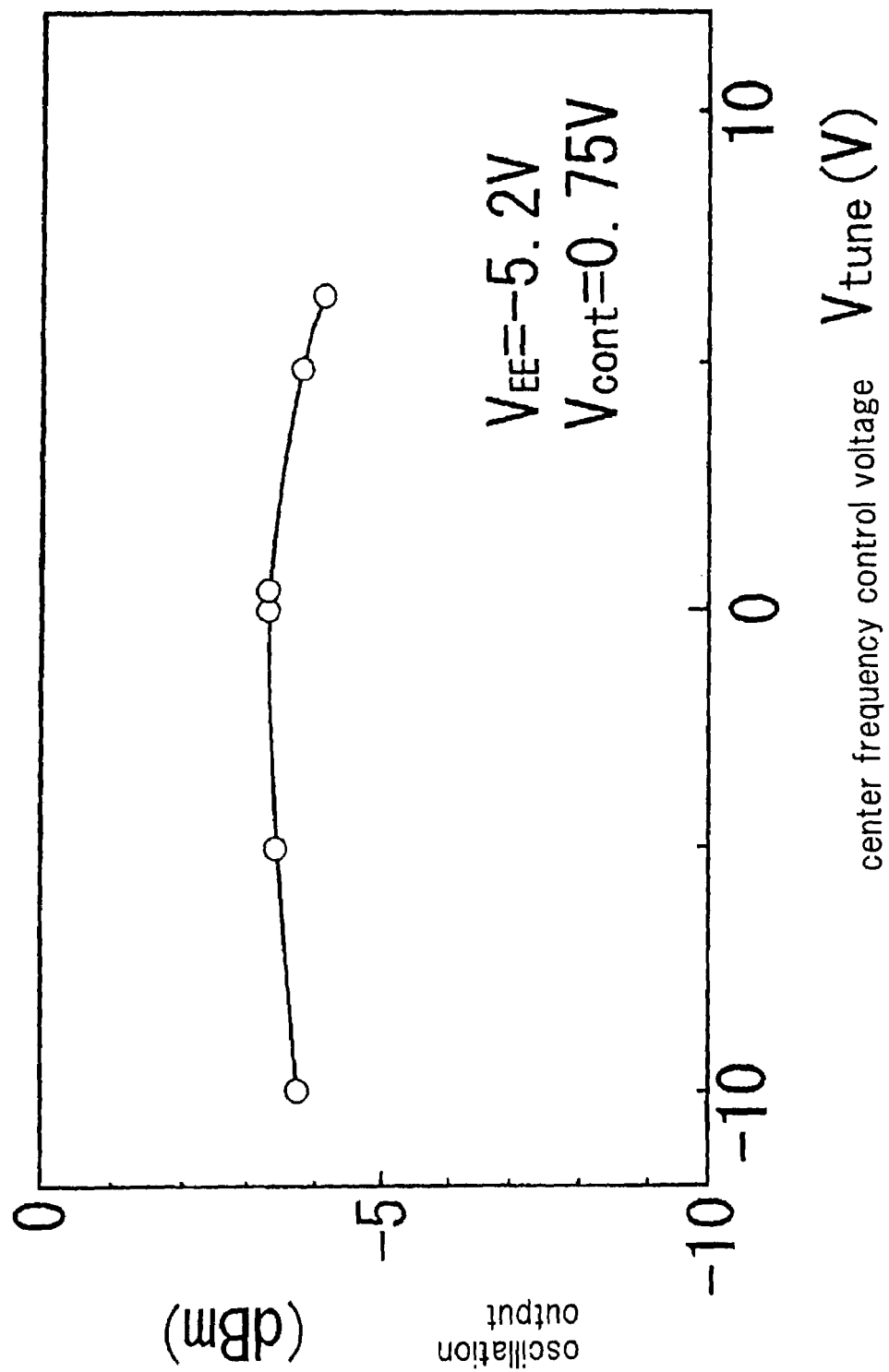
FIG. 13 is a view illustrating the simulation result of change in oscillation output power of a voltage controlled oscillator of the present invention for a center frequency control voltage.

FIG. 13 is a view illustrating the simulation result of a change of the oscillation output power (dBm) for center frequency control voltage $V_{tune}$ (V). As shown in FIG. 13, the oscillation output power is kept to be approximately constant for center frequency control voltage $V_{tune}$ (V).

Figure 14:
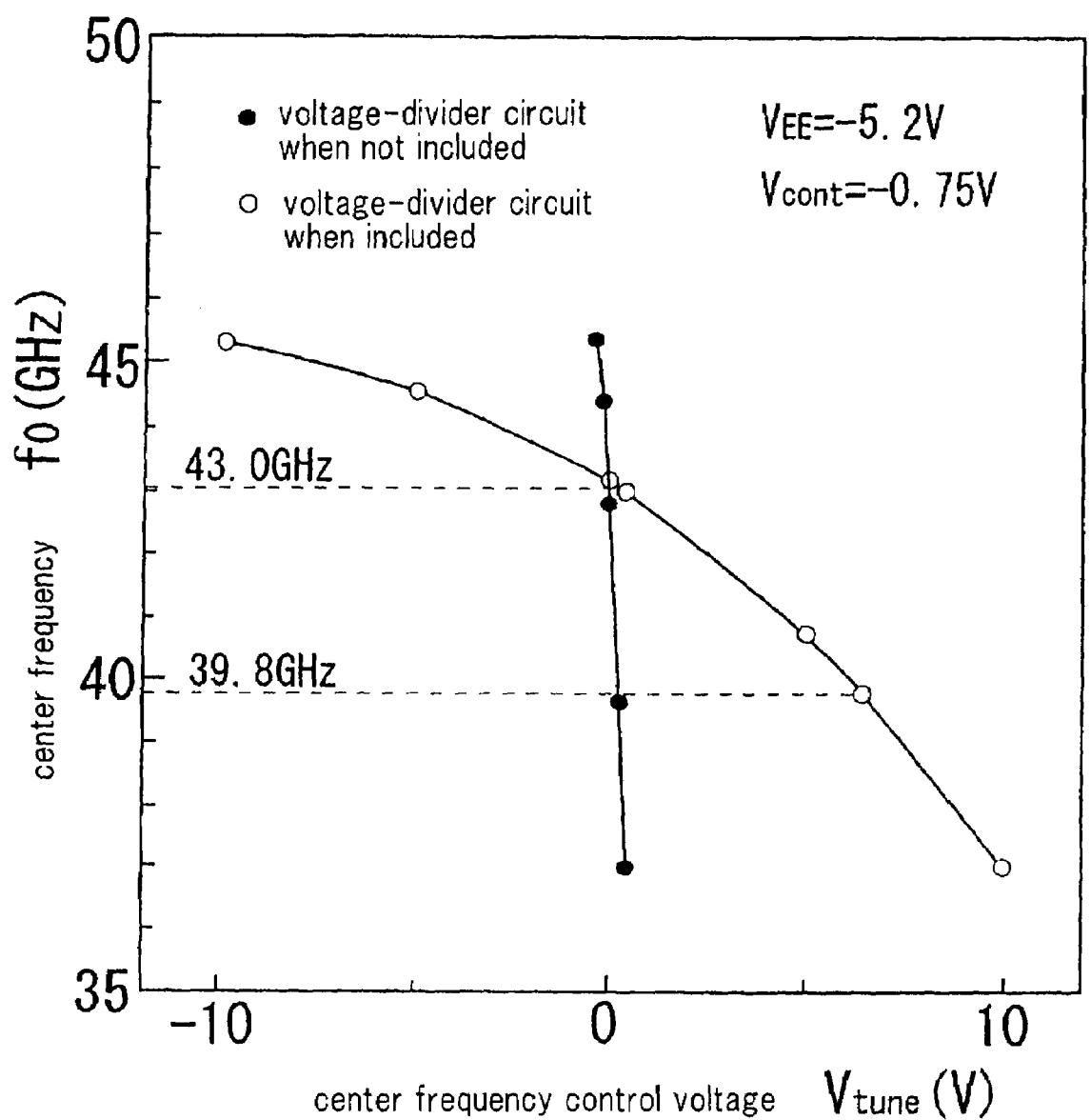
FIG. 14 is a view illustrating the simulation result of change in central frequency of the voltage controlled oscillator of the present invention for a center frequency control voltage.

FIG. 14 is a view illustrating the simulation result of a change of the central frequency $f_0$ (GHz) for center frequency control voltage $V_{tune}$ (V), when voltage-divider circuit 15 is provided and not provided, respectively.

In FIG. 14, the characteristic denoted by a filled circle without a voltage-divider circuit is that when center frequency control voltage $V_{tune}$ is changed from −0.5 V to 0.5 V, center frequency $f_0$ changes from about 45 GHz to about 37 GHz. Further, the characteristic denoted by an open circle in which there is a the voltage-divider circuit is that when center frequency control voltage $V_{tune}$ is changed from −10 V to 10 V, center frequency $f_0$ changes from about 45 GHz to about 37 GHz.

As seen from this, provision of voltage-divider circuit 15 can reduce the rate of change of center frequency $f_0$ for center frequency control voltage $V_{tune}$ to be from about −8 GHz/V (filled circle: the case without a voltage-divider circuit) to about −400 MHz/V (open circle: the case in which there is a voltage-divider circuit) by about 1/20. Therefore, even if a variation in voltage of center frequency control voltage $V_{tune}$ occurs, or external noises are mixed into center frequency control circuit 16, stability in oscillation operation can be maintained. At this time, a control range of center frequency $f_0$ is held as is.

THIRD EXEMPLARY EMBODIMENT

Figure 15:
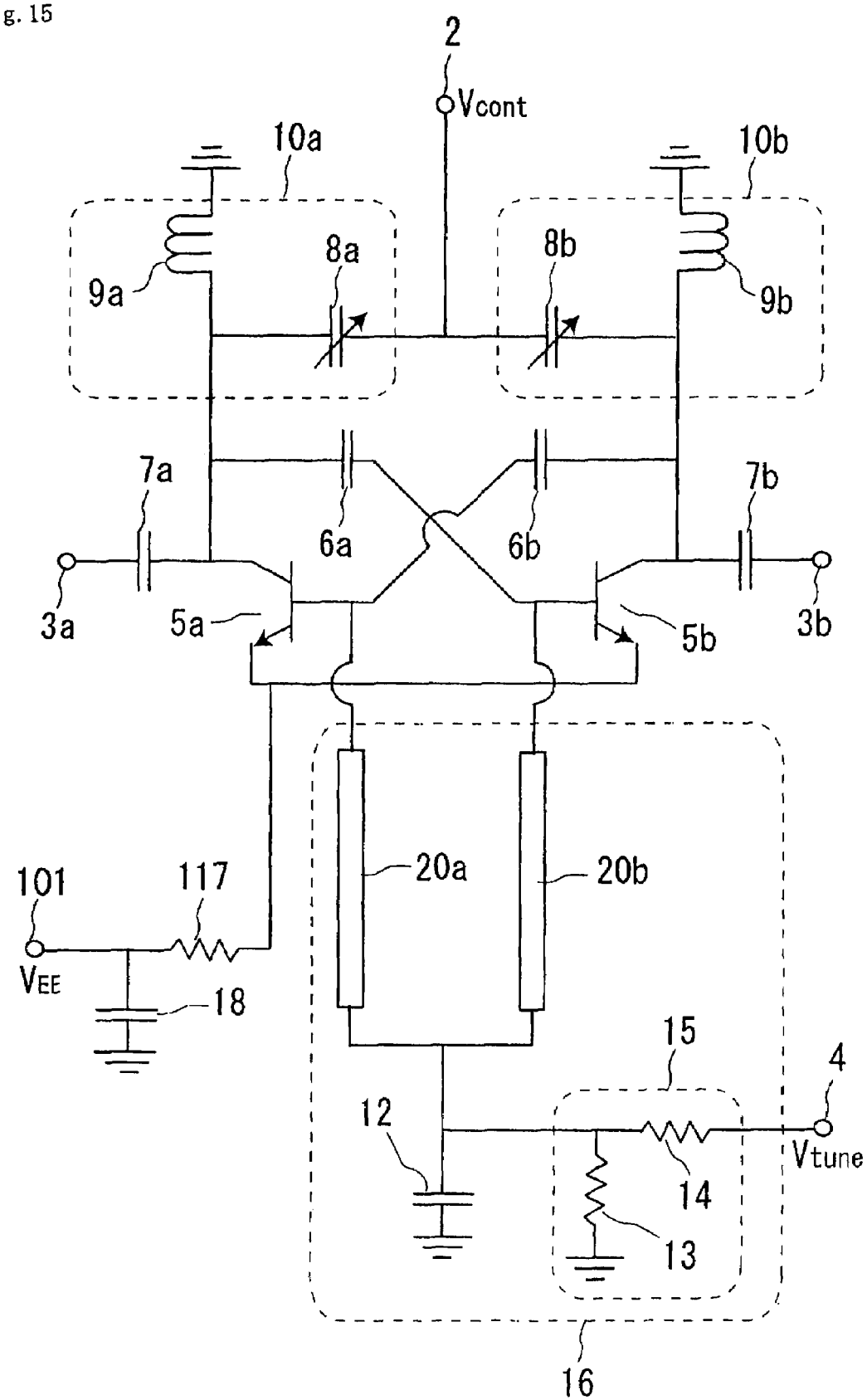
FIG. 15 is a circuit diagram illustrating a configuration of a voltage controlled oscillator according to a third exemplary embodiment.

FIG. 15 is a circuit diagram illustrating a configuration of a cross-coupled voltage controlled oscillator according to a third exemplary embodiment. In addition, in FIG. 15, the same part as in the first exemplary embodiment shown in FIG. 10 is denoted by the same symbol.

Referring to FIG. 15, the cross-coupled voltage controlled oscillator of this exemplary embodiment has resistors 11a, 11b of the cross-coupled voltage controlled oscillator shown in FIG. 10 replaced with transmission lines 20a, 20b. Here, transmission lines 20a, 20b have an electric length of a ¼ wavelength at any frequency within a predetermined oscillation frequency range and desirably, they have the electric length of a ¼ wavelength at the center frequency within a predetermined output frequency range. Such configuration may avoid use of a resistor with a large value, and may sometime bring an advantage in phase noise or a change in power supply voltage at the power supply terminal.

FOURTH EXEMPLARY EMBODIMENT

Figure 16:
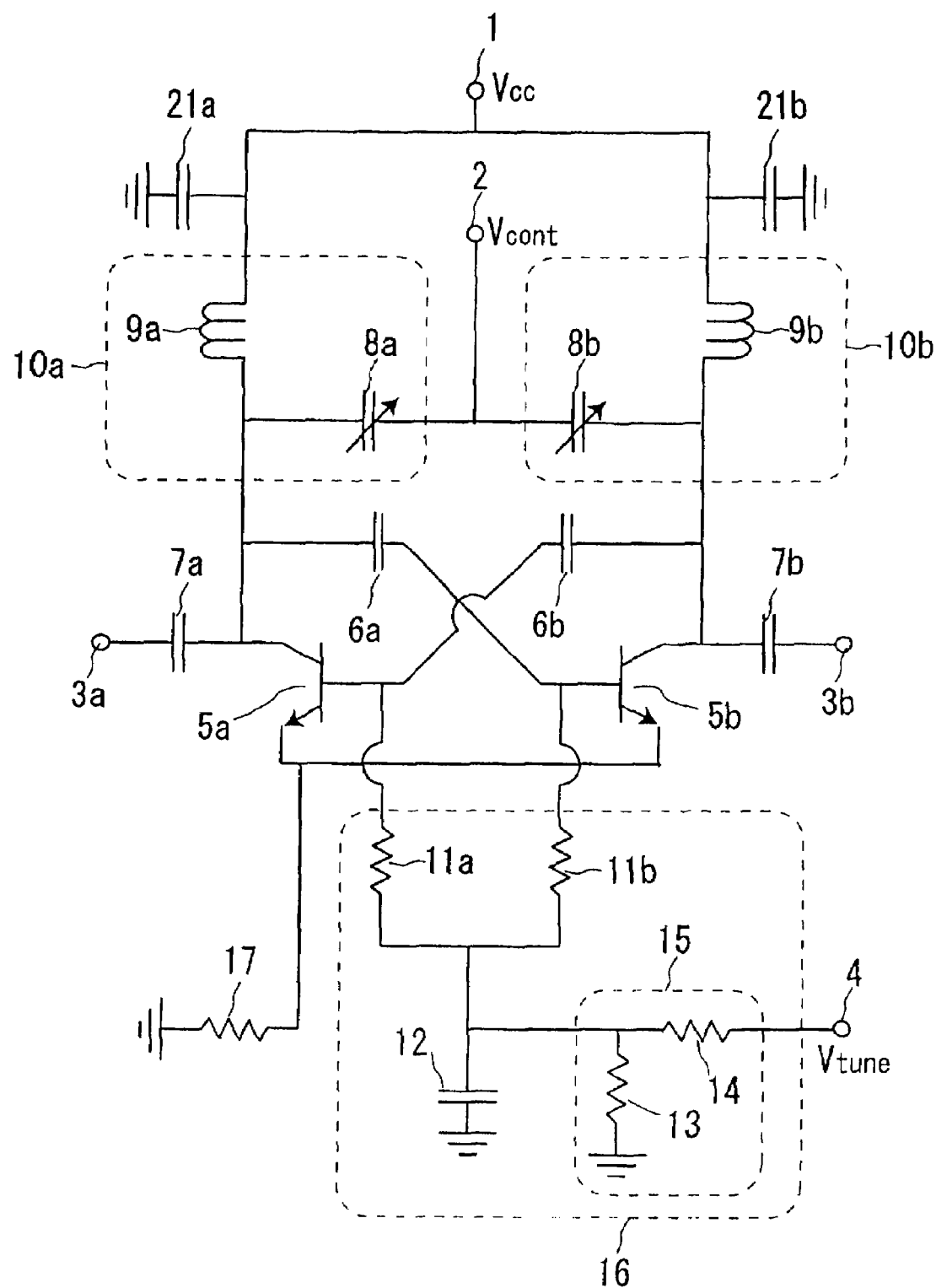
FIG. 16 is a circuit diagram illustrating a configuration of a voltage controlled oscillator according to a fourth exemplary embodiment.

FIG. 16 is a circuit diagram illustrating a configuration of a cross-coupled voltage controlled oscillator according to a fourth exemplary embodiment. In addition, in FIG. 16, the same part as in the first exemplary embodiment shown in FIG. 10 is denoted by the same symbol.

Referring to FIG. 16, in the cross-coupled voltage controlled oscillator of this exemplary embodiment, power supply terminal 1 to which positive power supply voltage Vcc to the ground potential is supplied is disposed on the side of the collector terminals of cross-coupled transistors 5a, 5b. Further, grounding capacitances 21a, 21b are provided. This exemplary embodiment is one example of a positive power supply standard in which the polarity of a power supply voltage supplied from power supply terminal 1 is positive.

Next, operation of the cross-coupled voltage controlled oscillator of the exemplary embodiment will be described.

The direct current operating point of cross-coupled transistors 5a, 5b is determined by center frequency control voltage $V_{tune}$ supplied from center frequency control terminal 4 through center frequency control circuit 16. Direct current blocking capacitance 6a separates the collector terminal of cross-coupled transistor 5a and the base terminal of cross-coupled transistor 5b in a direct current region. Further, direct current blocking capacitance 6b separates the collector terminal of cross-coupled transistor 5b and the base terminal of cross-coupled transistor 5a in a direct current region. Also, direct current blocking capacitance 7a, 7b separates the collector terminal of cross-coupled transistor 5a, 5b and the external circuit in a direct current region. Further, direct current blocking capacitance 6a, 6b separates center frequency control circuit 16 and the collector terminal side of cross-coupled transistor 5a, 5b in a direct current region.

With changing control voltage $V_{cont}$ supplied to control terminal 2, the capacitances of variable capacitances 8a, 8b change. Accordingly, the oscillation frequency of a signal provided from output terminals 3a, 3b is controlled as shown in FIG. 2.

In this exemplary embodiment, the base voltage of cross-coupled transistor 5a, 5b is controlled based on center frequency control voltage $V_{tune}$ supplied from center frequency control terminal 4 through center frequency control circuit 16. Accordingly, a characteristic between the base terminal and the collector terminal of cross-coupled transistor 5a, 5b, especially the junction capacitance is changed to control center frequency $f_0$ for center voltage $V_0$, providing a plurality of input/output characteristics (multi-band operation).

Resistors 11a, 11b separate the base terminals of cross-coupled transistors 5a, 5b from each other in a high-frequency region. Further, to avoid an effect caused by change in impedance of the external circuit connected to center frequency control terminal 4, grounding capacitance 12 is provided.

Oscillation frequency f is strongly dependent on the characteristics of cross-coupled transistor 5a, 5b, especially the junction capacitance between the base terminal and the collector terminal. Therefore, such configuration allows the center frequency to be controlled across a wider band. That is, continuous, input/output characteristics across a wide bandwidth as shown in FIG. 9 can be provided, and the multi-band operation across a wide range can be performed.

When such configuration is used, oscillation frequency f, as described above, is strongly dependent on the characteristic of cross-coupled transistors 5a, 5b, especially the junction capacitance between the base terminal and the collector terminal. Therefore, according to the effect caused by a change in the voltage of center frequency control voltage $V_{tune}$, or the effect of external noises mixed into center frequency control circuit 16, the oscillation operation tends to become unstable. To suppress these effects, in this exemplary embodiment, voltage-divider circuit 15 is provided.

Also in this exemplary embodiment as described above, similarly to the first to third exemplary embodiment, while maintaining stability against change in power supply voltage or maintaining stability of external noises, multi-band operation across a wider bandwidth can be provided using a simple configuration.

FIFTH EXEMPLARY EMBODIMENT

Figure 17:
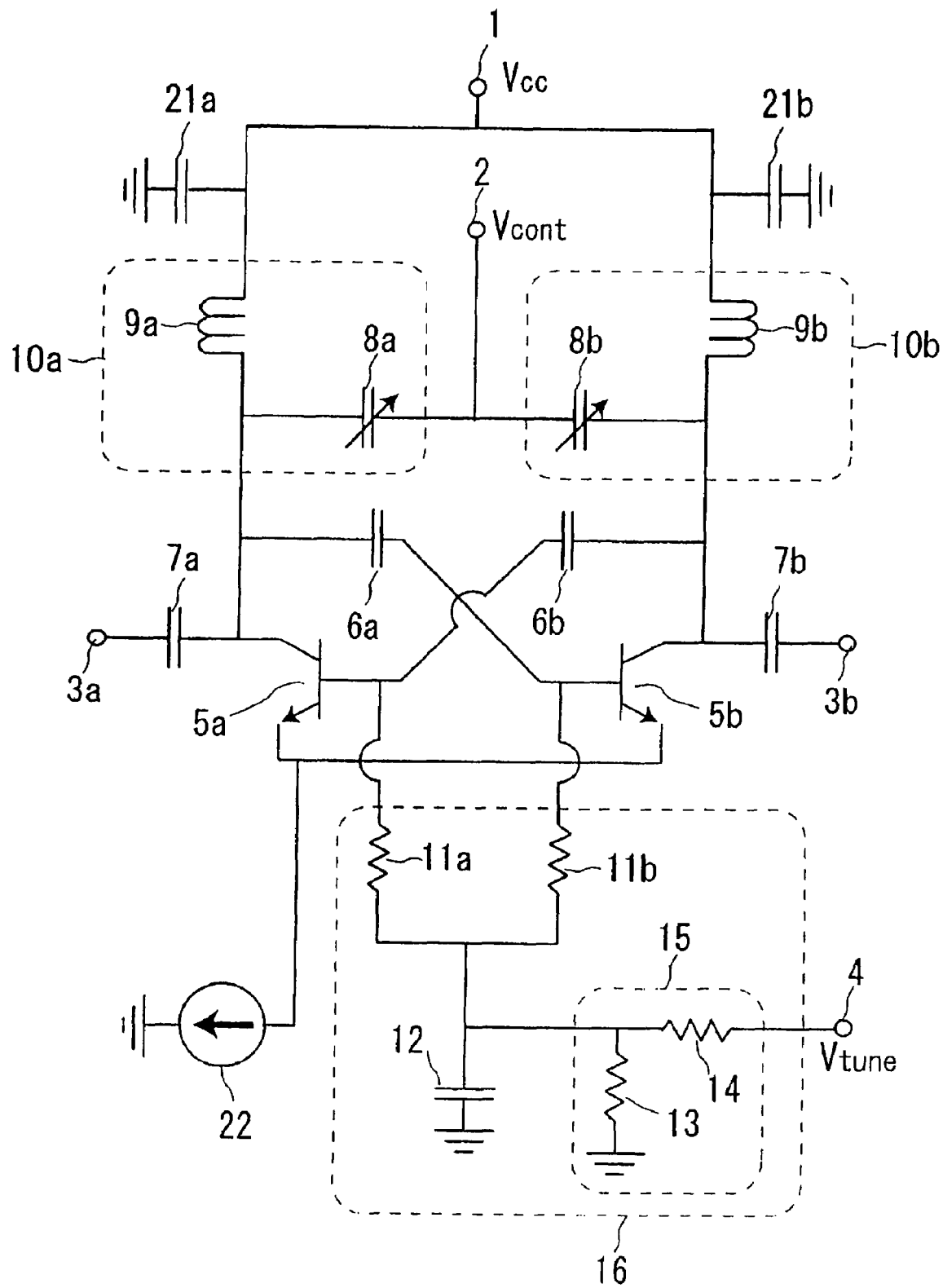
FIG. 17 is a circuit diagram illustrating a configuration of a voltage controlled oscillator according to a fifth exemplary embodiment.

FIG. 17 is a circuit diagram illustrating a configuration of a cross-coupled voltage controlled oscillator according to a fifth exemplary embodiment. In addition, in FIG. 17, the same part as in the fourth exemplary embodiment shown in FIG. 16 is denoted by the same symbol.

Referring to FIG. 17, the cross-coupled voltage controlled oscillator of this exemplary embodiment has resistor 17 of the cross-coupled voltage controlled oscillator shown in FIG. 16 replaced with current source 22. In addition, because operation of the cross-coupled voltage controlled oscillator of this exemplary embodiment is nearly the same as that of the fourth exemplary embodiment, its description will be omitted.

SIXTH EXEMPLARY EMBODIMENT

Figure 18:
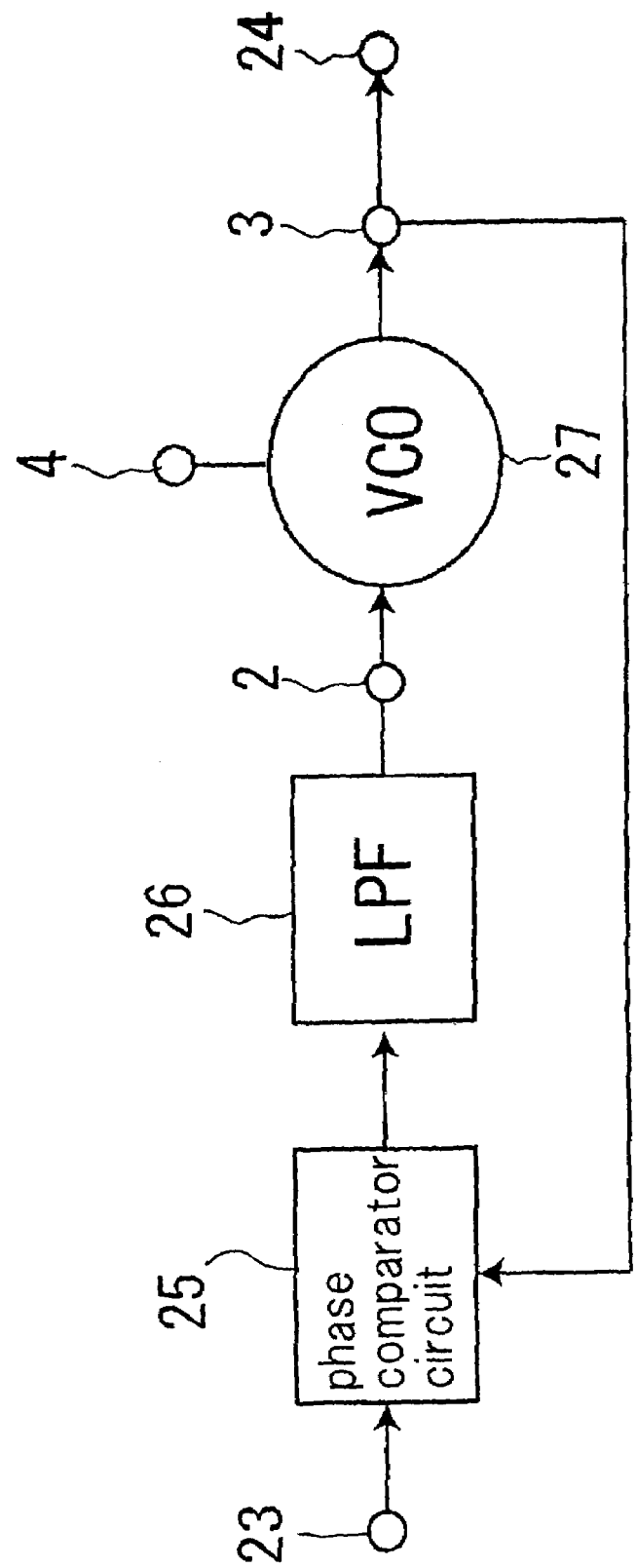
FIG. 18 is a block diagram illustrating one example of a configuration of a phase-locked loop circuit to which the voltage controlled oscillator of the present invention is applied.

FIG. 18 is a block diagram illustrating one example of a configuration of a phase-locked loop (PLL) circuit to which the cross-coupled voltage controlled oscillators of the first to fifth exemplary embodiments are applied.

Referring to FIG. 18, the PLL circuit according to this exemplary embodiment includes signal input terminal 23, signal output terminal 24, phase comparator circuit 25, loop filter (LPF) 26 and any of the cross-coupled voltage controlled oscillators 27 of the first to fifth exemplary embodiments. In addition, the output of cross-coupled voltage controlled oscillator 27 is a differential output, but, here for simplicity, output terminals 3a, 3b are collectively shown as "output terminal 3".

Phase comparator circuit 25 compares a phase of a signal provided from signal input terminal 23 with that of a signal fed back from output terminal 3 of cross-coupled voltage controlled oscillator 27, and outputs a phase difference therebetween. This output is supplied to control terminal 2 of cross-coupled voltage controlled oscillator 27 through loop filter (LPF) 26.

In this way, the PLL circuit according to this exemplary embodiment operates so that the phase of the signal provided from signal input terminal 23 and that of the output signal of cross-coupled voltage controlled oscillator 27 coincide with each other.

Then, the PLL circuit according to this exemplary embodiment can perform the multi-band operation by applying center frequency control voltage $V_{tune}$ to center frequency control terminal 4 of voltage controlled oscillator 27 and it can operate in a plurality of frequency bands.

SEVENTH EXEMPLARY EMBODIMENT

Figure 19:
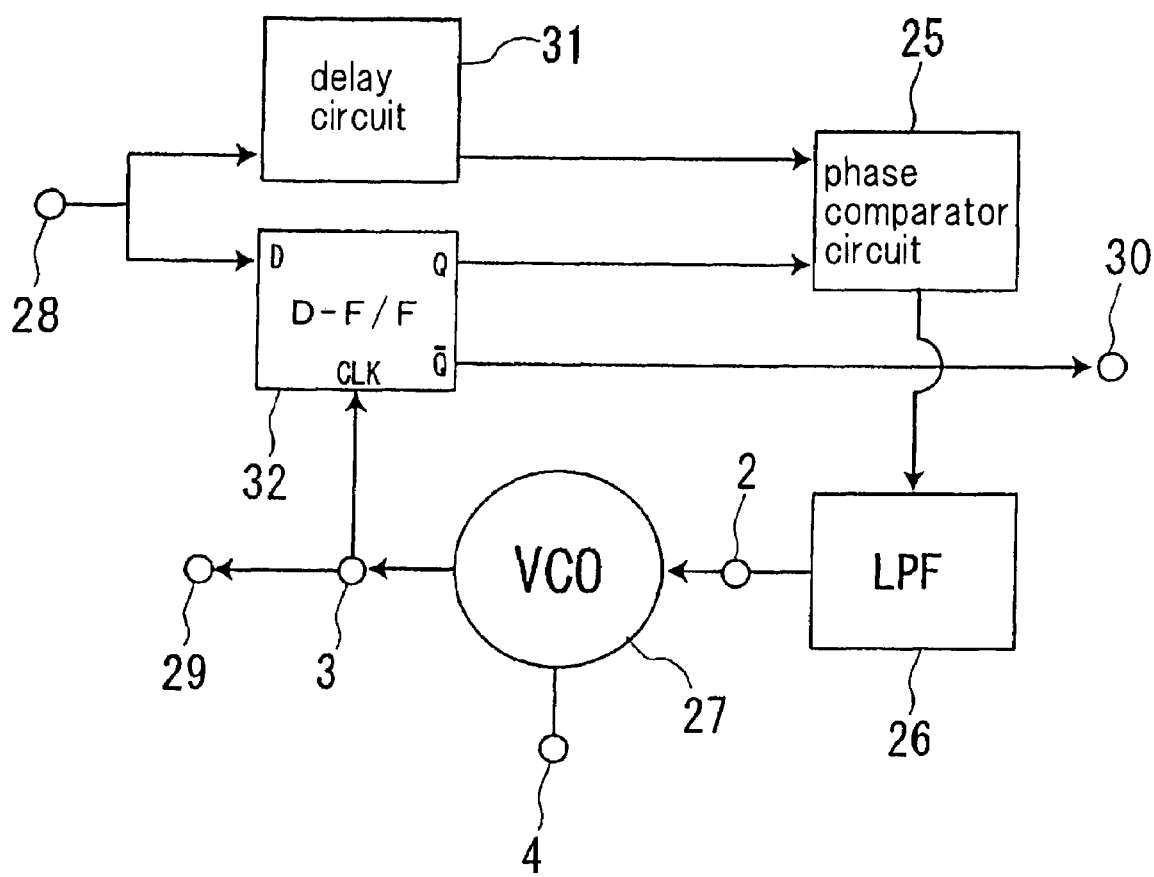
FIG. 19 is a block diagram illustrating one example of a configuration of a clock and data recovery circuit to which the voltage controlled oscillator of the present invention is applied.

FIG. 19 is a block diagram illustrating a configuration of a clock and data recovery (CDR) circuit to which the cross-coupled voltage controlled oscillators of the first to fifth exemplary embodiments are applied.

Referring to FIG. 19, the CDR circuit according to this exemplary embodiment includes phase comparator circuit 25, loop filter (LPF) 26, any of the cross-coupled voltage controlled oscillators 27 of the first to fifth exemplary embodiments, data signal input terminal 28, recovered clock signal output terminal 29, recovered data signal output terminal 30, delay circuit 31 for delaying a phase by 90° (by ½ bit) and D-type flip-flop circuit 32. In addition, the output of cross-coupled voltage controlled oscillator 27 is a differential output, but, here for simplicity, output terminals 3a, 3b are collectively shown as "output terminal 3".

A data signal provided from data signal input terminal 28 is supplied to delay circuit 31 and concurrently to data input terminal D of D-type flip-flop circuit 32. To clock input terminal CLK of D-type flip-flop circuit 32, a signal fed back from output terminal 3 of cross-coupled voltage controlled oscillator 27 is provided. Phase comparator circuit 25 compares the phase of a signal provided from delay circuit 31 with that of a signal provided from D-type flip-flop circuit 32, and outputs a phase difference therebetween. This output is supplied to control terminal 2 of cross-coupled voltage controlled oscillator 27 through loop filter (LPF) 26. The signal from output terminal 3 of cross-coupled voltage controlled oscillator 27 is output from recovered clock signal output terminal 29 as a recovered clock signal.

The CDR circuit according to this exemplary embodiment can perform a multi-band operation by applying center frequency control voltage $V_{tune}$ to center frequency control terminal 4 of voltage controlled oscillator 27 and it can operate at a plurality of bit rates.

EIGHTH EXEMPLARY EMBODIMENT

Figure 20:
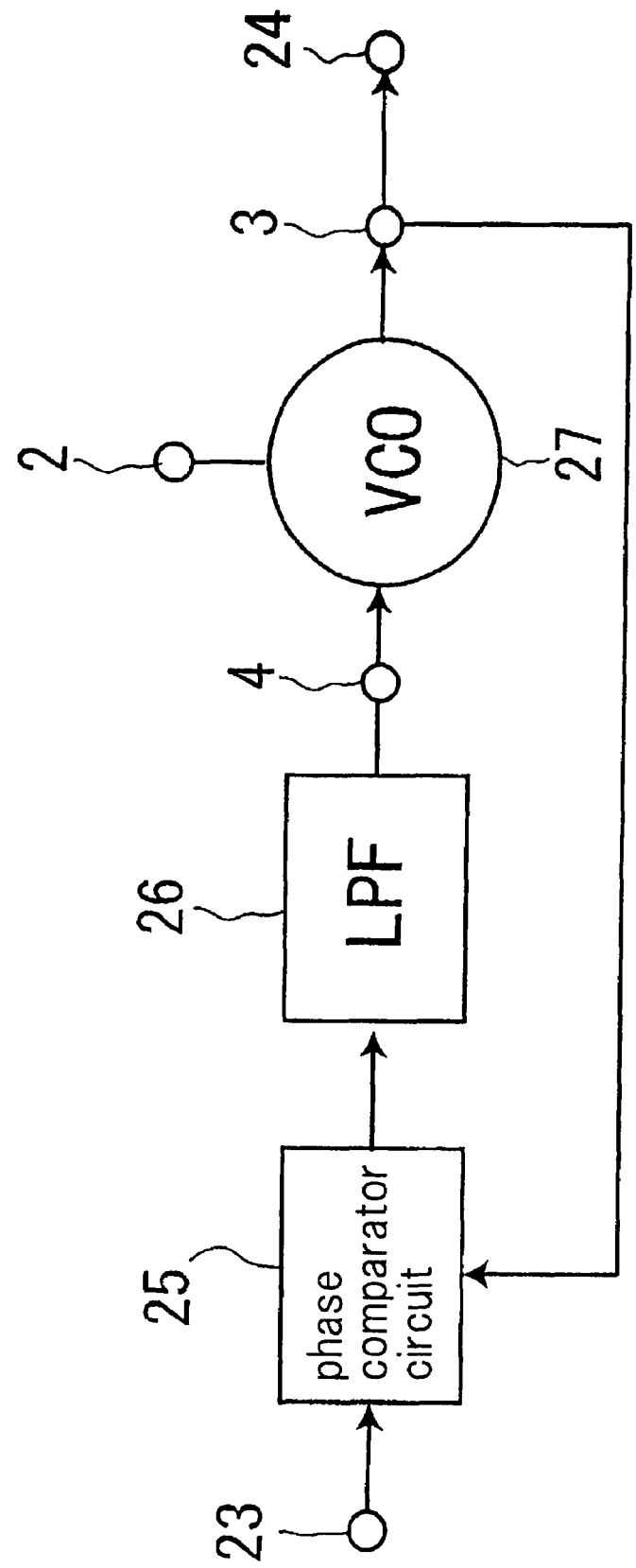
FIG. 20 is a block diagram illustrating another example of a configuration of a phase-locked loop circuit to which the voltage controlled oscillator of the present invention is applied.

FIG. 20 is a block diagram illustrating another example of a configuration of a phase-locked loop (PLL) circuit to which the cross-coupled voltage controlled oscillators of the first to fifth exemplary embodiments of the present invention are applied. In addition, in FIG. 20, the same part as in the sixth exemplary embodiment shown in FIG. 18 is denoted by the same symbol.

Referring to FIG. 20, the PLL circuit according to this exemplary embodiment, as compared to that of the sixth exemplary embodiment shown in FIG. 18, reverses the connection between control terminal 2 and center frequency control terminal 4 of voltage controlled oscillator 27. That is, even at control terminal 2 and at center frequency control terminal 4, the output frequency can be variably changed, so that even if a function of control terminal 2 and a function of center frequency control terminal 4 are exchanged, the PLL circuit according to this exemplary embodiment can operate. The other matters are the same as in the sixth exemplary embodiment, and their description in detail will be omitted.

NINTH EXEMPLARY EMBODIMENT

Figure 21:
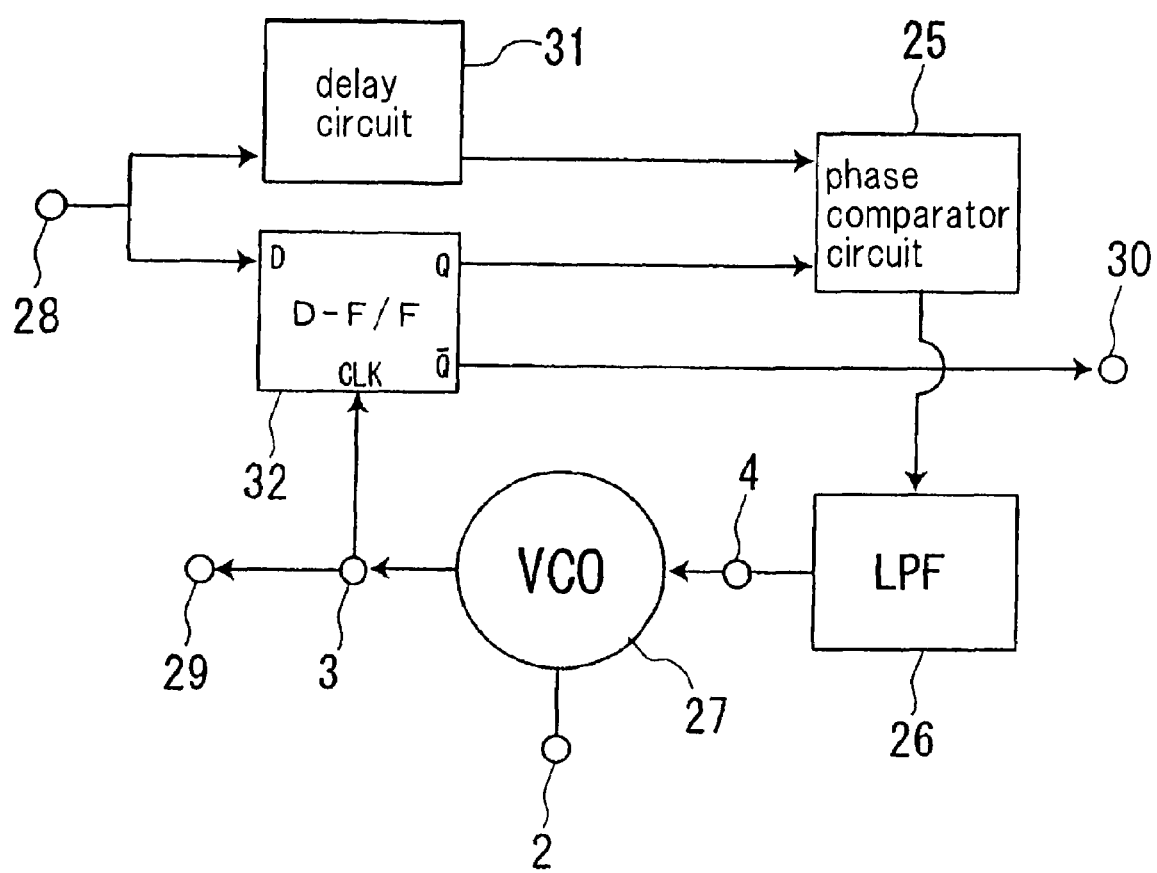
FIG. 21 is a block diagram illustrating another example of a configuration of a clock and data recovery circuit to which the voltage controlled oscillator of the present invention is applied.

FIG. 21 is a block diagram illustrating another example of a configuration of a clock and data recovery (CDR) circuit to which the cross-coupled voltage controlled oscillators of the first to fifth exemplary embodiments of the present invention are applied. In addition, in FIG. 21, the same part as in the seventh exemplary embodiment shown in FIG. 19 is denoted by the same symbol.

Referring to FIG. 21, the CDR circuit according to this exemplary embodiment, as compared to that of the seventh exemplary embodiment shown in FIG. 19, reverses the connection between control terminal 2 and center frequency control terminal 4 of voltage controlled oscillator 27. That is, even at control terminal 2 and at center frequency control terminal 4, the output frequency can be variably changed, so that even if a function of control terminal 2 and a function of center frequency control terminal 4 are exchanged, the CDR circuit according to this exemplary embodiment can operate. The other matters are the same as in the seventh exemplary embodiment, and their description in detail will be omitted.

In addition, the cross-coupled voltage controlled oscillators, the PLL circuits and the CDR circuits of the first to ninth exemplary embodiments can be used for a tuner portion, a demodulation portion and another portions where multi-band operation is necessary, in mobile communication systems such as mobile phones, receiver such as a TV receiver, a radio receiver, a display monitor with TV, various imaging systems (display devices), various computer systems including PCs, data transmission systems and another, various electronic devices.

Further, the cross-coupled voltage controlled oscillators, the PLL circuits and the CDR circuits of the first to ninth exemplary embodiments can be manufactured as a one-chip semiconductor system (semiconductor device) such as an IC, which can provide these in various application fields as a cheap component.

Moreover, in the first to ninth exemplary embodiments, examples in which the bipolar transistor is used as an active element have been described, but a similar configuration in which a field-effect transistor such as a MESFET (Metal Semiconductor Field Effect Transistor), a HEMT (High Electron Mobility Transistor) and a MOSFET (Metal Oxide Semiconductor Field Effect Transistor) is used may also provide a similar advantage. In this case, in the description of the exemplary embodiments described above, the base is read in a different way as the gate, the emitter is read as the source and the collector is read as the drain.

Also, in the first to ninth exemplary embodiments, an npn-transistor is used as the cross-coupled transistor, but a pnp-transistor may be used.

Further, in the first to ninth exemplary embodiments, when the voltage provided from control terminal 2 or center frequency control terminal 4 is a digital signal, discrete operation may be carried out by resolution of the least significant bit (for example, $1/256$ in the case of a 8-bit signal). This is because the voltage provided, in the exemplary embodiments above, is considered to be continuous, and change in frequency may also be considered to be continuous.

As described above, the present invention has been described with respect to the specific exemplary embodiments, but the present invention is not limited to these exemplary embodiments, and modifications may be obviously made to implement the present invention without departing from the scope of the present invention.

Further, the present invention can be widely used for electronic systems to which a voltage controlled oscillator is applied, as a voltage controlled oscillator capable of performing continuous, multi-band operation.

The invention claimed is:

1. A voltage controlled oscillator including a frequency control terminal, a variable capacitance and a transistor, which variably changes an output frequency depending on a voltage provided from the frequency control terminal, the frequency control terminal comprising:

a first frequency control terminal to which a voltage for controlling the output frequency by changing a capacitance of the variable capacitance is supplied; and
a second frequency control terminal to which a voltage for controlling a center frequency of the output frequency by changing an operating characteristic of the transistor is supplied;
a resistor connected to one of an emitter terminal and a source terminal of the transistor; and
a capacitance whose one end is connected to a connecting point at which the resistor and a power supply terminal are connected, and whose other end is grounded.

2. The voltage controlled oscillator according to claim 1, wherein collector terminals and base terminals of the transistor are connected to each other in a cross-coupled arrangement to form two cross-coupled transistors,
wherein the variable capacitance and an inductor comprise a resonant circuit, and
wherein the resonant circuit is configured to be excited by the cross-coupled transistors.

3. The voltage controlled oscillator according to claim 2, wherein a voltage for variably changing a junction capacitance at a base of the cross-coupled transistor is supplied to the second frequency control terminal.

4. A voltage controlled oscillator including a transistor and an LC tank, which variably changes an output frequency by exciting the LC tank to oscillate using the transistor, said voltage controlled oscillator comprising:
first frequency control means for variably changing the output frequency by exciting the LC tank to oscillate;
second frequency control means for variably changing the output frequency by changing an operating characteristic of the transistor;
a resistor connected to one of an emitter terminal and a source terminal of the transistor; and
a capacitance whose one end is connected to a connecting point at which the resistor and a power supply terminal are connected, and whose other end is grounded.

5. The voltage controlled oscillator according to claim 4, wherein the second frequency control means variably changes the output frequency by changing a voltage at a base terminal or a gate terminal of the transistor.

6. A voltage controlled oscillator including two cross-coupled transistors connected to each other in a cross-coupled arrangement and an LC tank including an inductor and a variable capacitance, which variably changes an output frequency by exciting the LC tank to oscillate using the cross-coupled transistors, said voltage controlled oscillator comprising:
first frequency control means for variably changing the output frequency by changing a capacitance of the variable capacitance;
second frequency control means for variably changing the output frequency by changing a voltage at a base terminal or a gate terminal of the cross-coupled transistors;
a resistor connected to one of an emitter terminal and a source terminal of the transistor; and
a capacitance whose one end is connected to a connecting point at which the resistor and a power supply terminal are connected, and whose other end is grounded.

7. A voltage controlled oscillator including two cross-coupled transistors whose collector terminals and base terminals are connected to each other in a cross-coupled arrangement, an LC tank including an inductor and a variable capacitance, and a control terminal to which a first control voltage for variably changing a resonant frequency of the LC tank by variably changing a capacitance of the variable capacitance is supplied, which excites the LC tank to oscillate using the cross-coupled transistors and controls an output frequency depending on the first control voltage, said voltage controlled oscillator comprising center frequency control means for controlling a center frequency of the output frequency that is controlled depending on a second control voltage by changing a voltage at the base terminal of the cross-coupled transistors, said center frequency control means comprising:

two resistors whose ends are connected to the base terminal of the two cross-coupled transistors, respectively, and whose other ends are connected to each other;

a grounding capacitance whose one end is connected to a connecting point at which the other ends of the two resistors are connected to each other, and whose other end is grounded; and a voltage-divider circuit for dividing the center frequency control voltage, whose one end is connected to the connecting point at which the other ends of the two resistors are connected to each other, and whose other end is connected to a center frequency control terminal which supplies the center frequency control voltage.

8. A voltage controlled oscillator including a control terminal for controlling an output frequency and a center frequency control terminal for controlling a center frequency of the output frequency, said voltage controlled oscillator comprising a center frequency control circuit disposed between a base terminal or a gate terminal of two cross-coupled transistors connected to each other in a cross-coupled arrangement, and the center frequency control terminal, for controlling the output frequency by changing a voltage applied from the center frequency control terminal to the base terminal or to the gate terminal of the cross-coupled transistors, said center frequency control circuit comprising:

two resistors connected to the base terminal or to the gate terminal of the two cross-coupled transistors. respectively; and a capacitance whose one end is connected between the two resistors and the center frequency control terminal, and whose other end is grounded.

9. The voltage controlled oscillator according to claim 8, further comprising a voltage-divider circuit disposed between the center frequency control terminal and the resistors.

10. A voltage controlled oscillator including a control terminal for controlling an output frequency and a center frequency control terminal for controlling a center frequency of the output frequency, said voltage controlled oscillator comprising a center frequency control circuit disposed between a base terminal or a gate terminal of two cross-coupled transistors connected to each other in a cross-coupled arrangement, and the center frequency control terminal, for controlling the output frequency by changing a voltage applied from the center frequency control terminal to the base terminal or to the gate terminal of the cross-coupled transistors, the center frequency control circuit comprising:

two transmission lines connected to the base terminal or to the gate terminal of the two cross-coupled transistors, respectively, and including an electric length of a ¼ wavelength at any frequency within a predetermined frequency range; and a capacitance whose one end is connected between the two transmission lines and the center frequency control terminal, and whose other end is grounded.

11. The voltage controlled oscillator according to claim 10, further comprising a voltage-divider circuit disposed between the center frequency control terminal and the transmission lines.

* * * * *